(12) United States Patent  
Niwa

(10) Patent No.: US 11,245,861 B2  
(45) Date of Patent: Feb. 8, 2022

(54) SOLID-STATE IMAGING ELEMENT

(71) Applicant: Sony Semiconductor Solutions Corporation, Kanagawa (JP)

(72) Inventor: Atsumi Niwa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/479,758

(22) PCT Filed: Jul. 18, 2018

(86) PCT No.: PCT/JP2018/026802  
§ 371 (c)(1),  
(2) Date: Jul. 22, 2019

(87) PCT Pub. No.: WO2019/087472  
PCT Pub. Date: May 9, 2019

(65) Prior Publication Data  
US 2021/0258519 A1 Aug. 19, 2021

(30) Foreign Application Priority Data  
Oct. 30, 2017 (JP) .............................. JP2017-209046

(51) Int. Cl.  
*H04N 5/351* (2011.01)  
*H04N 5/369* (2011.01)  
*H04N 5/3745* (2011.01)

(52) U.S. Cl.  
CPC ............. *H04N 5/351* (2013.01); *H04N 5/379* (2018.08); *H04N 5/3745* (2013.01)

(58) Field of Classification Search  
CPC .................................................. H04N 5/351  
(Continued)

(56) References Cited

U.S. PATENT DOCUMENTS 5,376,813 A * 12/1994 Delbruck ............ H01L 27/1443  
257/288  
6,253,161 B1 * 6/2001 Arias-Estrada ........ H04N 5/374  
702/150  
(Continued)

FOREIGN PATENT DOCUMENTS

CN 103813156 A 5/2014  
CN 104078473 A 10/2014  
(Continued)

OTHER PUBLICATIONS

International Written Opinion dated Oct. 16, 2018 in connection with International Application No. PCT/JP2018/026802, and English translation thereof.

(Continued)

*Primary Examiner* — Anthony J Daniels  
(74) *Attorney, Agent, or Firm* — Wolf, Greenfield & Sacks, P.C.

(57) ABSTRACT

Stability of a current-voltage conversion circuit is increased in a solid-state imaging element that converts photocurrent to a voltage signal.  
A photodiode photoelectrically converts incident light and generates photocurrent. A conversion transistor converts photocurrent to a voltage signal and outputs the voltage signal from a gate. A current source transistor supplies predetermined constant current to an output signal line connected to the gate. A voltage supply transistor supplies a certain voltage corresponding to the predetermined constant current from the output signal line to a source of the conversion transistor. A capacitance is connected between the gate and the source of the conversion transistor.

12 Claims, 20 Drawing Sheets

(58) Field of Classification Search
USPC .................................. 348/294; 250/208.1
See application file for complete search history.

(56) References Cited

U.S. PATENT DOCUMENTS

| | | | |
|---|---|---|---|
| 7,697,050 | B1 | 4/2010 | Lee |
| 7,728,269 | B2* | 6/2010 | Lichtsteiner ........... H04N 5/341 |
| | | | 250/208.1 |
| 7,791,664 | B1* | 9/2010 | Koifman ............ H04N 5/37457 |
| | | | 348/308 |
| 9,967,479 | B2* | 5/2018 | Matolin .................. H04N 5/341 |
| 10,321,081 | B2* | 6/2019 | Watanabe .............. H04N 5/378 |
| 2009/0167406 | A1 | 7/2009 | Endo |
| 2012/0175497 | A1 | 7/2012 | Hynecek |
| 2014/0125994 | A1 | 5/2014 | Kim et al. |
| 2014/0284745 | A1 | 9/2014 | Seta |
| 2015/0194454 | A1 | 7/2015 | Kim et al. |
| 2015/0244962 | A1* | 8/2015 | Sonoda ................. G01T 1/2018 |
| | | | 250/208.1 |
| 2016/0191825 | A1 | 6/2016 | Sato et al. |
| 2017/0041517 | A1 | 2/2017 | Ikeda |
| 2017/0059399 | A1* | 3/2017 | Suh ...................... H04N 5/3745 |
| 2019/0052821 | A1* | 2/2019 | Berner .................... H04N 5/363 |
| 2020/0029033 | A1* | 1/2020 | Xu ......................... H04N 5/357 |

FOREIGN PATENT DOCUMENTS

| | | |
|---|---|---|
| CN | 104272723 A | 1/2015 |
| CN | 106537898 A | 3/2017 |
| CN | 106878633 A | 6/2017 |
| CN | 208848911 U | 5/2019 |
| DE | 10 2013 111 729 A1 | 5/2014 |
| EP | 2075913 A2 | 7/2009 |
| JP | 2009-164681 A | 7/2009 |
| JP | 2014-187261 A | 10/2014 |
| JP | 2016127593 A | 7/2016 |
| JP | 2016-533140 A | 10/2016 |
| WO | 2017/009944 A1 | 1/2017 |

OTHER PUBLICATIONS

International Preliminary Report on Patentability dated May 14, 2020 in connection with International Application No. PCT/JP2018/026802, and English translation thereof.

Chinese Office Action dated Sep. 1, 2020 in connection with Chinese Application No. 201810964359.9, and English translation thereof.

International Search Report and English translation thereof dated Oct. 16, 2018 in connection with International Application No. PCT/JP2018/026802.

* cited by examiner

SOLID-STATE IMAGING ELEMENT

CROSS REFERENCE TO RELATED APPLICATIONS

This application claims the benefit under 35 U.S.C. § 371 as a U.S. National Stage Entry of International Application No. PCT/JP2018/026802, filed in the Japanese Patent Office as a Receiving Office on Jul. 18, 2018, which claims priority to Japanese Patent Application Number JP 2017-209046, filed in the Japanese Patent Office on Oct. 30, 2017, each of which is hereby incorporated by reference in its entirety.

TECHNICAL FIELD

The present technology relates to a solid-state imaging element. More specifically, the present technology relates to a solid-state imaging element that detects an address event.

BACKGROUND ART

Conventionally, a synchronous type solid-state imaging element that images image data (frame) in synchronization with a synchronizing signal, e.g., a vertical synchronizing signal, has been used in an imaging apparatus or the like. This general synchronous type solid-state imaging element can acquire image data only at a cycle (e.g., 1/60 seconds) of a synchronizing signal. Therefore, in the field related to traffic, robots, or the like, it is difficult to take a response in a case where a faster processing is demanded. Thus, there has been proposed an asynchronous type solid-state imaging element in which an address event detection circuit that detects in real time the fact that the amount of light of a pixel exceeds a threshold as an event is provided with respect to each pixel (see, for example, Patent Document 1). The address event detection circuit includes a current-voltage conversion circuit including two N-type transistors that are connected in a looped pattern, and photocurrent from a photodiode is converted into a voltage signal by the circuit.

CITATION LIST

Patent Document

Patent Document 1: Japanese Patent Application Laid-Open No. 2016-533140

SUMMARY OF THE INVENTION

Problems to be Solved by the Invention

The aforementioned asynchronous type solid-state imaging element can generate and output data much faster than a synchronous type solid-state imaging element. Therefore, for example, in the field of traffic, it is possible to execute at high speed processing of image recognition of a person or an obstacle, and increase the safety. However, since the two N-type transistors in the current-voltage conversion circuit are connected in a looped pattern, the loop circuit can be a negative feedback circuit such that a voltage signal may be oscillated under a certain condition. Thus, the aforementioned conventional technology has a problem that the current-voltage conversion circuit becomes unstable.

The present technology has been made in view of such a situation, and it is an object of the present technology to increase stability of a current-voltage conversion circuit in a solid-state imaging element that converts photocurrent to a voltage signal.

Solutions to Problems

The present technology has been made in order to solve the aforementioned problem, and a first aspect thereof is a solid-state imaging element including: a photodiode that photoelectrically converts incident light and generates photocurrent; a conversion transistor that converts the photocurrent to a voltage signal and outputs the voltage signal from a gate; a current source transistor that supplies predetermined constant current to an output signal line connected to the gate; a voltage supply transistor that supplies a certain voltage corresponding to the predetermined constant current from the output signal line to a source of the conversion transistor; and a capacitance that is connected between the gate and the source of the conversion transistor. Thus, an operation that a phase delay of an output signal is compensated is provided.

Furthermore, in the first aspect, a gate of the voltage supply transistor may be connected to the source of the conversion transistor via an input signal line, and the capacitance may be an interwiring capacitance between the input signal line and the output signal line. Thus, an operation that a phase delay of an output signal is compensated by the interwiring capacitance is provided.

Furthermore, in the first aspect, the input signal line and the output signal line may be wired to mutually different wiring layers. Thus, an operation that a capacitance occurs between the signal lines wired to different wiring layers is provided.

Furthermore, in the first aspect, the input signal line and the output signal line may be wired to the same wiring layer. Thus, an operation that a capacitance occurs between the signal lines wired to the same wiring layer is provided.

Furthermore, in the first aspect, the capacitance may be a gate capacitance of a transistor. Thus, an operation that a phase delay of an output signal is compensated by a gate capacitance of a transistor is provided.

Furthermore, the first aspect may further include: a buffer that corrects the voltage signal; a subtractor that reduces a level of the corrected voltage signal; and a quantizer that quantizes the reduced voltage signal, in which the photodiode is provided on a light receiving chip stacked on a detection chip, and the quantizer is provided on a detection chip stacked on the light receiving chip. Thus, an operation that circuits are arranged on the light receiving chip and the detection chip in a distributed manner is provided.

Furthermore, in the first aspect, the conversion transistor, the current source transistor, the voltage supply transistor, and the capacitance may be provided on the detection chip. Thus, an operation that current is converted to voltage by the detection chip is provided.

Furthermore, in the first aspect, the conversion transistor and the voltage supply transistor may be N-type transistors, the current source transistor may be a P-type transistor, the conversion transistor, the voltage supply transistor, and the capacitance may be provided on the light receiving chip, and the current source transistor may be provided on the detection chip. Thus, an operation that only N-type transistors are arranged on the light receiving chip is provided.

Furthermore, in the first aspect, the subtractor may include: a first capacitance having one end connected to an output terminal of the buffer; an inverter including an input terminal connected to the other end of the first capacitance; and a second capacitance connected to the inverter in parallel, in which a capacitance value of each of the capacitance and the second capacitance may be smaller than a capacitance value of the first capacitance. Thus, an operation that the voltage signal is subtracted is provided.

Furthermore, in the first aspect, the buffer and the first capacitance may be provided on the light receiving chip, and the inverter and the second capacitance may be provided on the detection chip. Thus, an operation that elements in the subtractor are arranged on the light receiving chip and the detection chip in a distributed manner is provided.

Furthermore, in the first aspect, the buffer and the subtractor may be provided on the detection chip. Thus, an operation that the circuit scale of the light receiving chip is reduced for the buffer and the subtractor is provided.

Furthermore, in the first aspect, the buffer may be provided on the light receiving chip, and the subtractor may be provided on the detection chip. Thus, an operation that the buffer and the subtractor are arranged on the light receiving chip and the detection chip in a distributed manner is provided.

Furthermore, the first aspect may further include a shield provided between the light receiving chip and the detection chip. Thus, an operation that electromagnetic noise is reduced is provided.

Effects of the Invention

The present technology can provide an excellent effect that it is possible to increase stability of a current-voltage conversion circuit in a solid-state imaging element that converts photocurrent to a voltage signal. Note that effects described herein are not necessarily limited, but may also be any of those described in the present disclosure.

MODE FOR CARRYING OUT THE INVENTION

Modes for carrying out the present technology (hereinafter, the embodiments) are described below. A description is given in the order described below.

1. First embodiment (example in which capacitor is provided as capacitance)
2. Second embodiment (example in which interwiring capacitance is provided as capacitance)
3. Third embodiment (example in which interwiring capacitance between signal lines wired to the same wiring layer is provided as capacitance)
4. Fourth embodiment (example in which gate capacitance of transistor is provided as capacitance)
5. Fifth embodiment (example in which capacitance and N-type transistors are provided on light receiving chip)
6. Sixth embodiment (example in which capacitance and two capacitors are arranged on light receiving chip and detection chip in distributed manner)
7. Seventh embodiment (example in which current-voltage conversion circuit including capacitance is provided on light receiving chip)
8. Eighth embodiment (example in which current-voltage conversion circuit including capacitance and buffer are provided on light receiving chip)
9. Application example to mobile body 1. First Embodiment

[Configuration Example of Imaging Apparatus]

Figure 1:
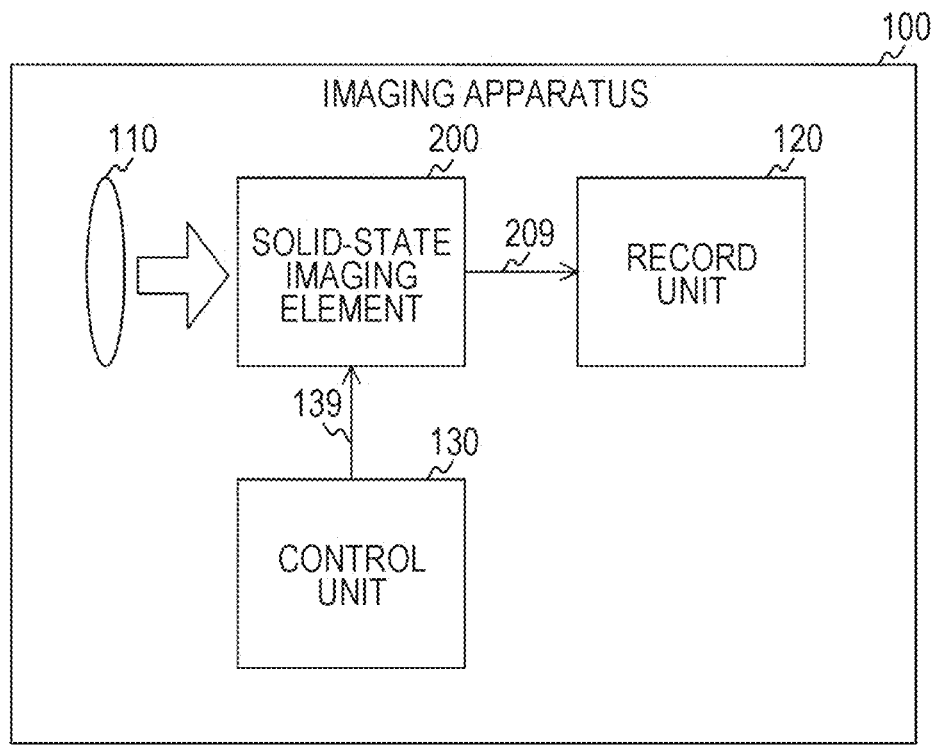
FIG. 1 is a block diagram illustrating a configuration example of an imaging apparatus according to a first embodiment of the present technology.

FIG. 1 is a block diagram illustrating a configuration example of an imaging apparatus 100 according to the first embodiment of the present technology. The imaging apparatus 100 captures image data, and includes an imaging lens 110, a solid-state imaging element 200, a record unit 120, and a control unit 130. The imaging apparatus 100 is assumed to be a camera mounted on an industrial robot, an automotive camera, or the like.

The imaging lens 110 collects incident light and guides the collected incident light to the solid-state imaging element 200. The solid-state imaging element 200 photoelectrically converts the incident light and captures image data. The solid-state imaging element 200, with respect to the captured image data, executes predetermined signal processing, e.g., image recognition processing, on the image data, and outputs the processed data to the record unit 120 via a signal line 209.

The record unit 120 records data from the solid-state imaging element 200. The control unit 130 controls the solid-state imaging element 200 to capture image data.

[Configuration Example of Solid-State Imaging Element]

Figure 2:
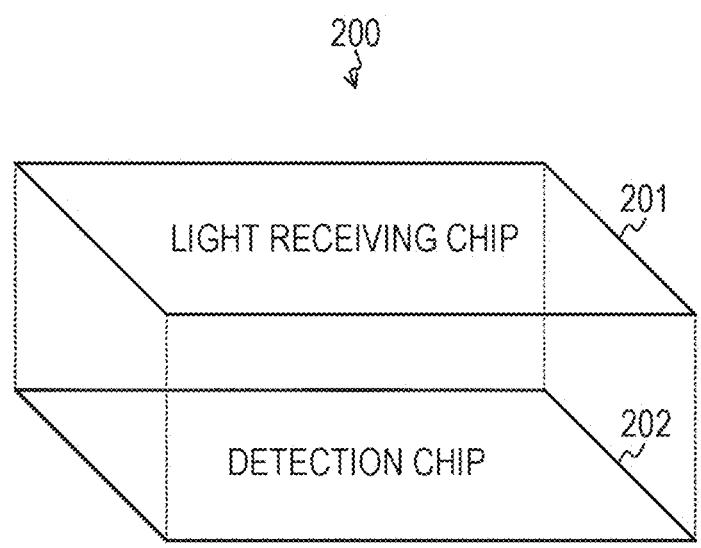
FIG. 2 is a diagram illustrating an example of a stack structure of a solid-state imaging element according to the first embodiment of the present technology.

FIG. 2 is a diagram illustrating an example of a stack structure of the solid-state imaging element 200 according to the first embodiment of the present technology.

The solid-state imaging element 200 includes a detection chip 202 and a light receiving chip 201 stacked on the detection chip 202. These chips are bonded by a via or the like. Note that, bonding may be performed by Cu-Cu bonding or bumping in addition to a via.

Figure 3:
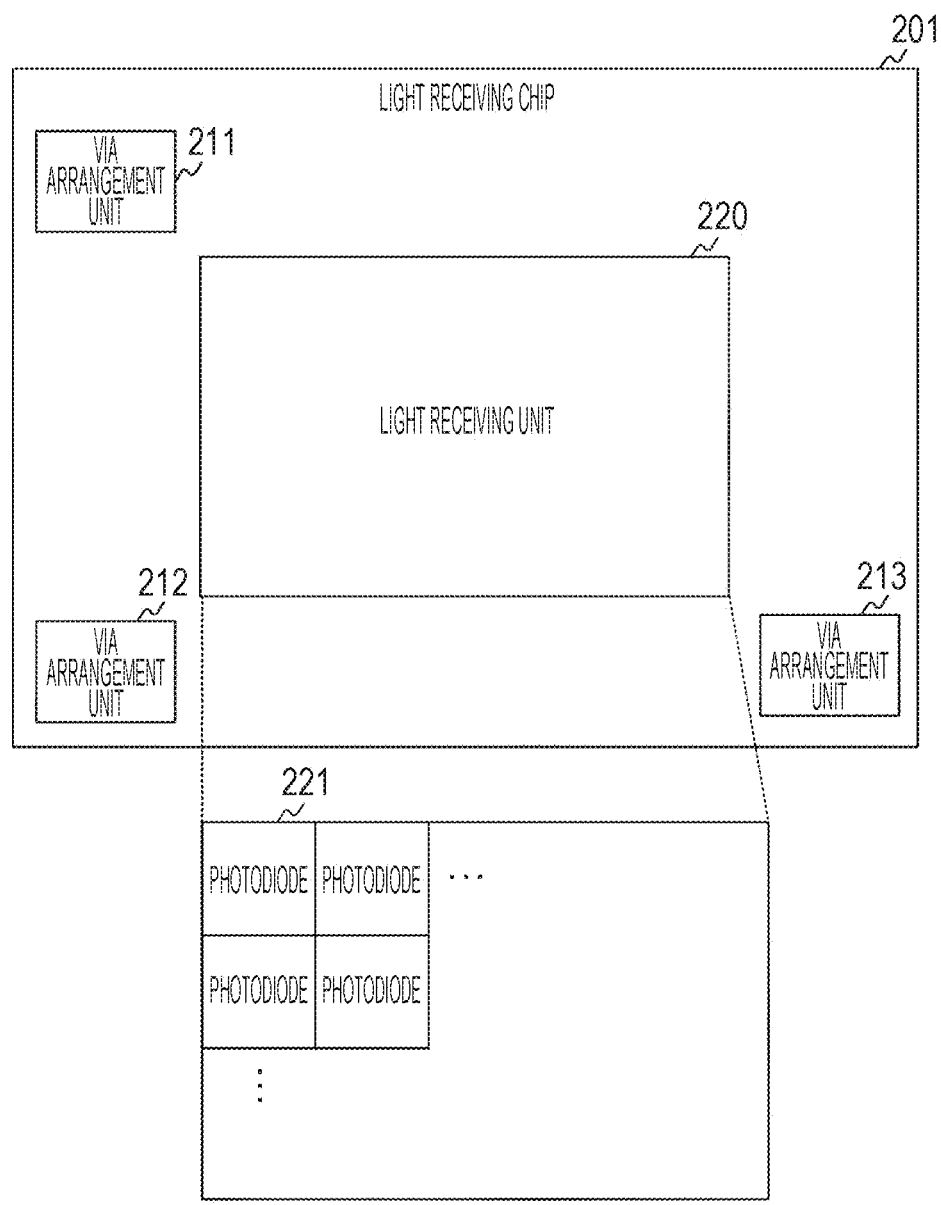
FIG. 3 is an example of a plan view of a light receiving chip according to the first embodiment of the present technology.

FIG. 3 is an example of a plan view of the light receiving chip 201 according to the first embodiment of the present technology. The light receiving chip 201 includes a light reception unit 220 and via arrangement portions 211, 212 and 213.

At the via arrangement portions 211, 212 and 213, vias connected to the detection chip 202 are arranged. Furthermore, at the light reception unit 220, a plurality of photodiodes 221 is arranged in a two-dimensional grid pattern. The photodiodes 221 photoelectrically convert the incident light and generate photocurrent. Each of the photodiodes 221 is assigned with a pixel address including a row address and a column address, and is treated as a pixel.

Figure 4:
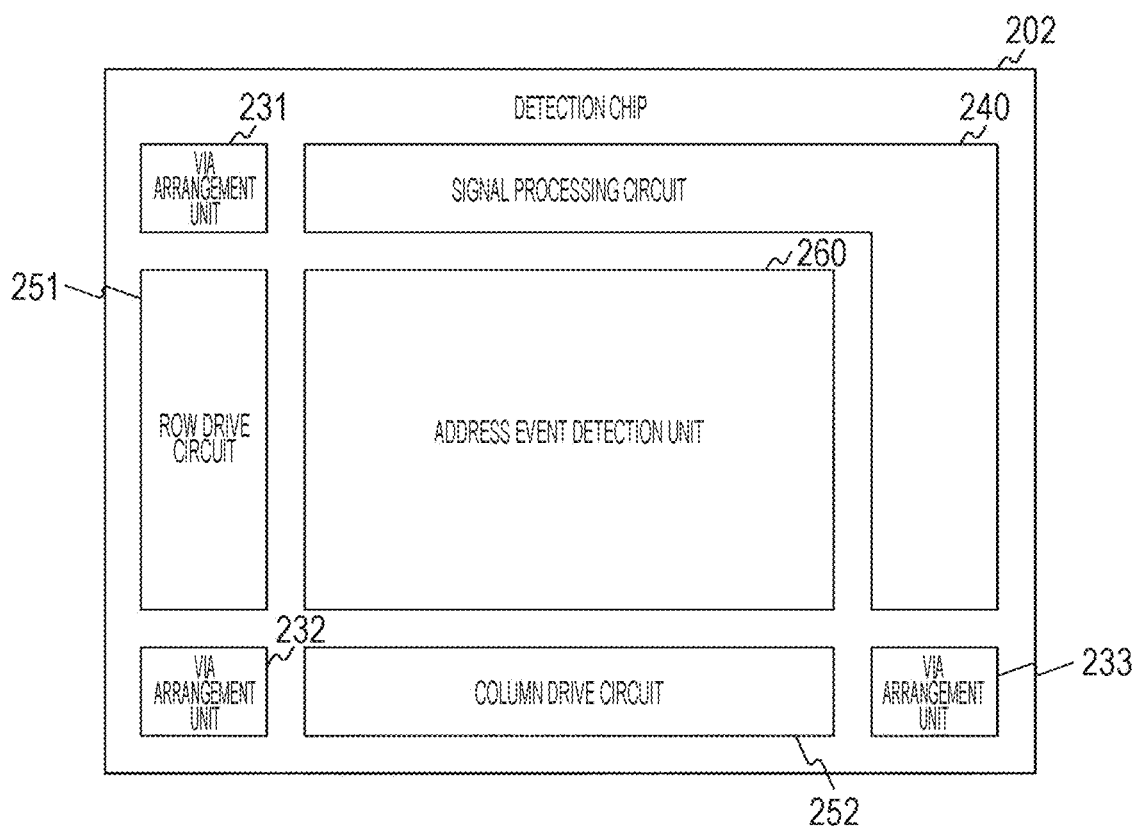
FIG. 4 is an example of a plan view of a detection chip according to the first embodiment of the present technology.

FIG. 4 is an example of a plan view of the detection chip 202 according to the first embodiment of the present technology. The detection chip 202 includes via arrangement portions 231, 232 and 233, a signal processing circuit 240, a row drive circuit 251, a column drive circuit 252, and an address event detection unit 260. At the via arrangement portions 231, 232 and 233, vias connected to the light receiving chip 201 are arranged.

The address event detection unit 260 generates a detection signal from the photocurrent of each of the plurality of photodiodes 221 and outputs the detection signal to the signal processing circuit 240. The detection signal is a 1-bit signal indicating whether or not the fact that the amount of light of the incident light has exceeded a predetermined threshold is detected as an address event.

The row drive circuit 251 selects a row address and causes the address event detection unit 260 to output a detection signal corresponding to the row address.

The column drive circuit 252 selects a column address and causes the address event detection unit 260 to output a detection signal corresponding to the column address.

The signal processing circuit 240 executes predetermined signal processing on the detection signal from the address event detection unit 260. The signal processing circuit 240 arranges the detection signal as a pixel signal in a two-dimensional grid pattern, and acquires image data having 1-bit information with respect to each pixel. Then, the signal processing circuit 240 executes signal processing, e.g., image recognition processing, on the image data.

Figure 5:
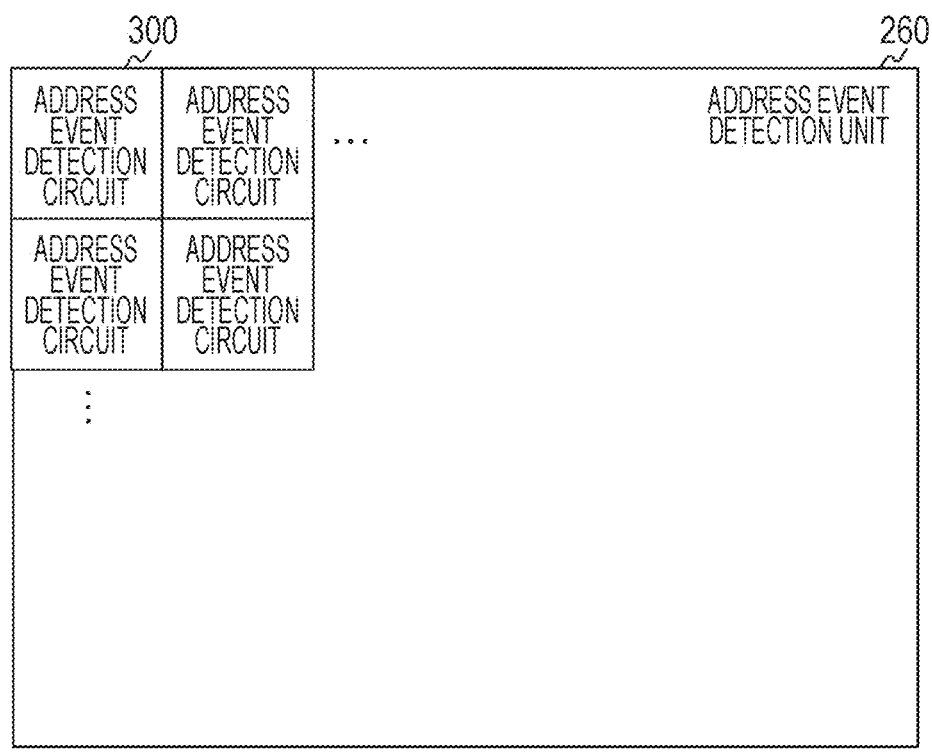
FIG. 5 is an example of a plan view of an address event detection unit according to the first embodiment of the present technology.

FIG. 5 is an example of a plan view of the address event detection unit 260 according to the first embodiment of the present technology. At the address event detection unit 260, a plurality of address event detection circuits 300 is arranged in a two-dimensional grid pattern. Each of the address event detection circuits 300 is assigned with a pixel address, and is connected to the photodiode 221 of the same address.

The address event detection circuits 300 quantize a voltage signal corresponding to the photocurrent from the corresponding photodiode 221 and output the quantized voltage signal as a detection signal.

[Configuration Example of Address Event Detection Circuit]

Figure 6:
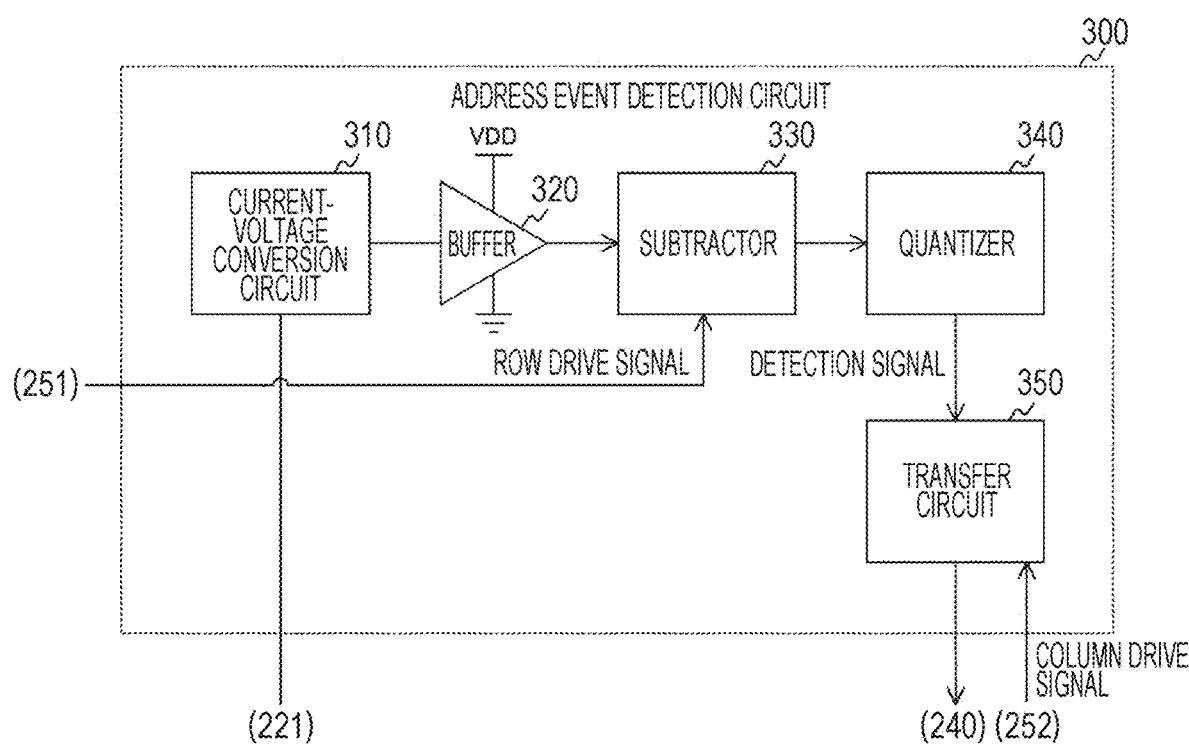
FIG. 6 is a block diagram illustrating a configuration example of an address event detection circuit according to the first embodiment of the present technology.

FIG. 6 is a block diagram illustrating a configuration example of the address event detection circuit 300 according to the first embodiment of the present technology. The address event detection circuit 300 includes a current-voltage conversion circuit 310, a buffer 320, a subtractor 330, a quantizer 340, and a transfer circuit 350.

The current-voltage conversion circuit 310 converts the photocurrent from the corresponding photodiode 221 to a voltage signal. The current-voltage conversion circuit 310 supplies the voltage signal to the buffer 320.

The buffer 320 corrects the voltage signal from the current-voltage conversion circuit 310. The buffer 320 outputs the corrected voltage signal to the subtractor 330.

The subtractor 330 reduces the level of the voltage signal from the buffer 320 according to a row drive signal from the row drive circuit 251. The subtractor 330 supplies the reduced voltage signal to the quantizer 340.

The quantizer 340 quantizes the voltage signal from the subtractor 330 to a digital signal and outputs the quantized voltage signal as a detection signal to the transfer circuit 350.

The transfer circuit 350 transfers the detection signal from the quantizer 340 to the signal processing circuit 240 according to a column drive signal from the column drive circuit 252.

[Configuration Example of Current-Voltage Conversion Circuit]

Figure 7:
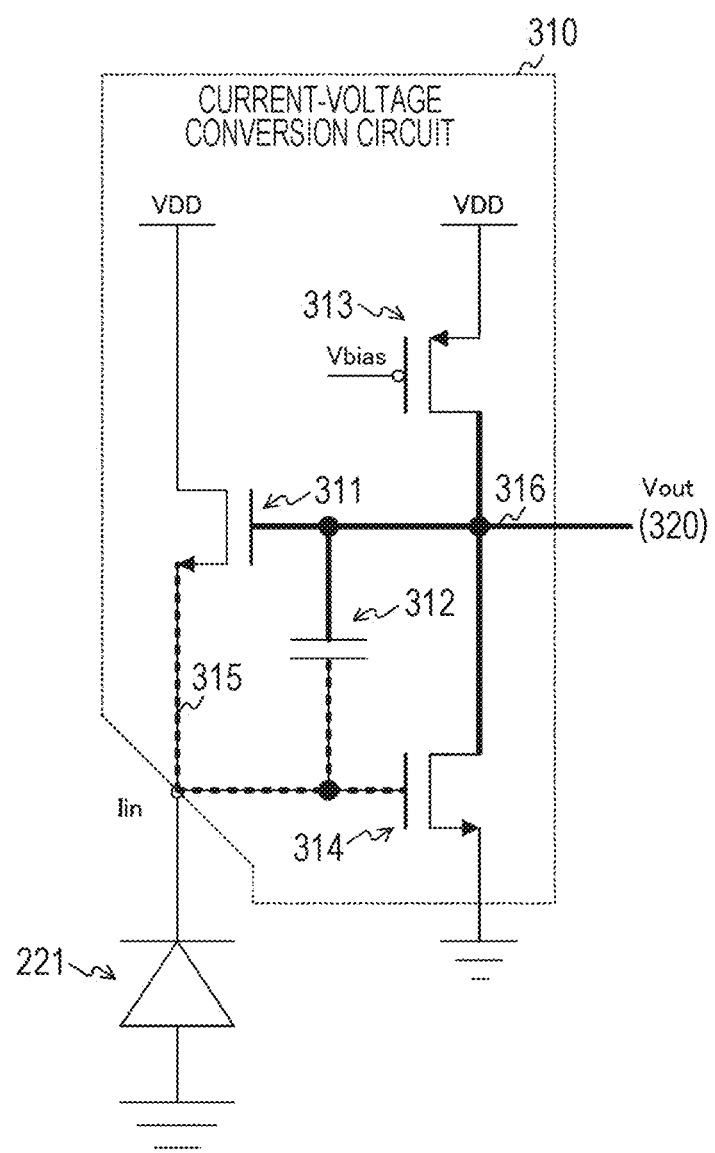
FIG. 7 is a circuit diagram illustrating a configuration example of a current-voltage conversion circuit according to the first embodiment of the present technology.

FIG. 7 is a circuit diagram illustrating a configuration example of the current-voltage conversion circuit 310 according to the first embodiment of the present technology. The current-voltage conversion circuit 310 includes a conversion transistor 311, a capacitor 312, a current source transistor 313, and a voltage supply transistor 314. As the conversion transistor 311 and the voltage supply transistor 314, for example, an N-type metal-oxide-semiconductor (MOS) transistor is used. Furthermore, as the current source transistor 313, for example, a P-type MOS transistor is used.

The conversion transistor 311 converts photocurrent $I_{in}$ from the corresponding photodiode 221 to voltage signal $V_{out}$ and outputs the voltage signal $V_{out}$ through a gate. The source of the conversion transistor 311 is connected to the cathode of the photodiode 221 via an input signal line 315 and to the gate of the voltage supply transistor 314. Furthermore, the drain of the conversion transistor 311 is connected to a power source, and the gate is connected to the drain of the current source transistor 313 via an output signal line 316, the drain of the voltage supply transistor 314, and the input terminal of the buffer 320.

The current source transistor 313 supplies predetermined constant current to the output signal line 316. Predetermined bias current $V_{bias}$ is applied to the gate of the current source transistor 313. The source is connected to a power source, and the drain is connected to the output signal line 316.

The voltage supply transistor 314 supplies a certain voltage corresponding to the constant current from the output signal line 316 to the source of the conversion transistor 311 via the input signal line 315. Thus, the source voltage of the conversion transistor 311 is fixed to a constant voltage. Accordingly, when light is incident, a gate-source voltage of the conversion transistor 311 rises depending on the photocurrent, and the level of the voltage signal $V_{out}$ rises.

Both ends of the capacitor 312 are connected to the gate and the source of the conversion transistor 311 via the input signal line 315 and the output signal line 316. The capacitor 312 functions as a capacitance that compensates the phase delay of the voltage signal $V_{out}$. Note that, in addition to the capacitor 312, as will be described later, an interwiring capacitance or a capacitive element, e.g., a transistor, may be used as the capacitance. Note that the capacitor 312 is an example of the capacitance stated in the claims.

As described above, because the conversion transistor 311 and the voltage supply transistor 314 are connected in a looped pattern, the loop circuit becomes a negative feedback circuit under predetermined conditions, and the voltage signal $V_{out}$ may be oscillated. When the loop circuit becomes unstable, incident light may be detected erroneously. Therefore, it is desirable that the stability be increased.

Open loop transfer function $T_{open}(s)$ of the loop circuit including the conversion transistor 311 and the voltage supply transistor 314 is expressed by the following formula:

[Mathematical 1]

$$T_{open}(s) = \frac{g_m G_m R_O}{(g_m + sC_{pd})(1 + sC_O R_O)} \quad \text{Formula 1}$$

In the above formula, $g_m$ indicates the transconductance of the conversion transistor 311, and $G_m$ indicates the transconductance of the voltage supply transistor 314. $R_O$ indicates the output resistance of the loop circuit, and s indicates a complex number. $C_{pd}$ indicates the capacitance of the conversion transistor 311 on the source side, and $C_O$ is the gate capacitance of the conversion transistor 311. The unit of the transconductance is, for example, siemens (S), and the unit of the resistance is, for example, ohm ($\Omega$). Furthermore, the unit of the capacitance is, for example, farad (F).

According to Formula 1, the open loop transfer function is quadratic, and a pole which is the root of the function at a time when the transfer function is infinite varies depending on the illuminance of light. At this time, if the specification of the dynamic range of a sensor is 120 decibels (dB), because the conversion transistor 311 is operated at less than a threshold (i.e., weak inversion operation), the position of the pole also moves about six digits.

Figure 8:
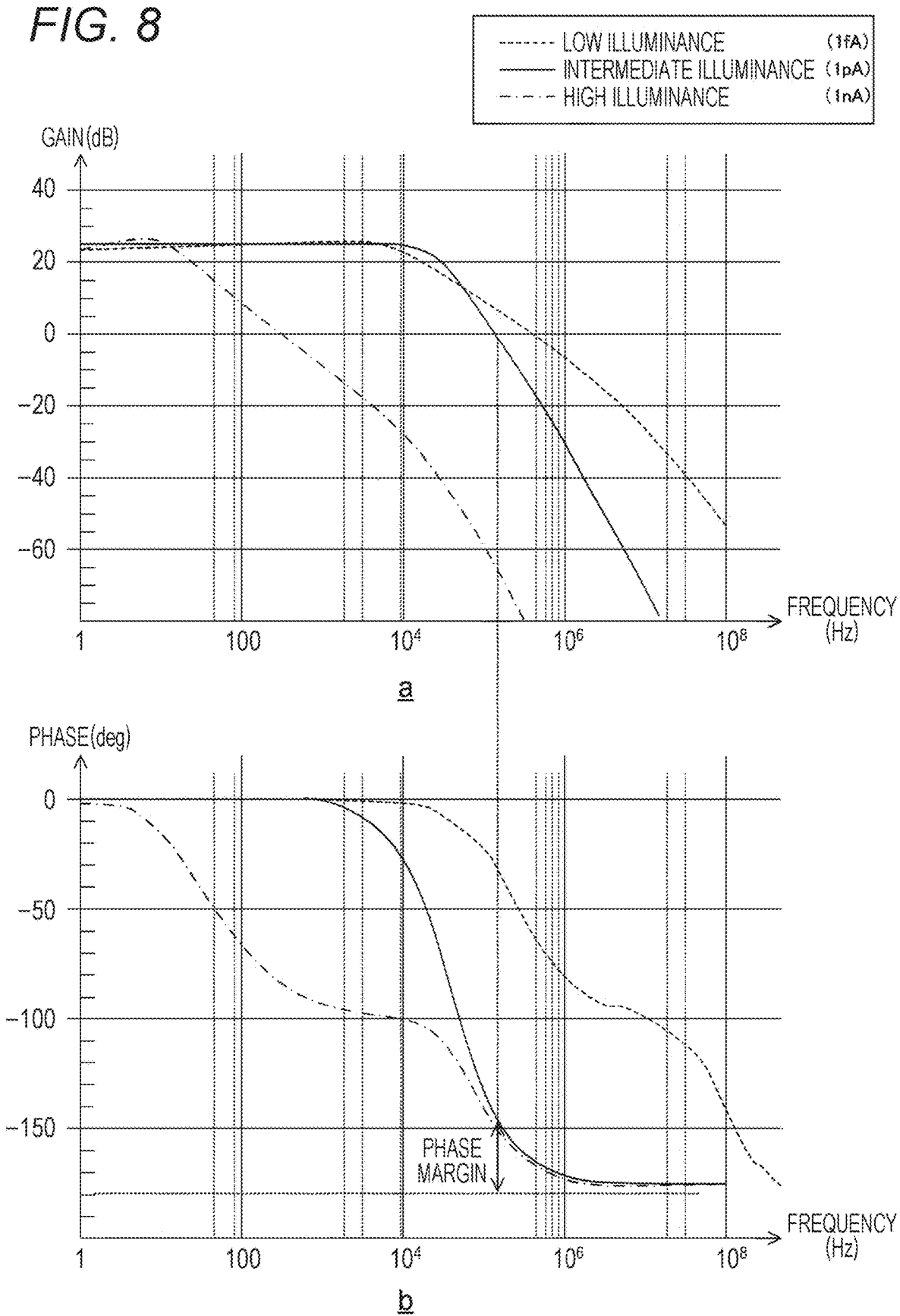
FIG. 8 is an example of a Bode plot of a loop circuit according to the first embodiment of the present technology.

FIG. 8 is an example of a Bode plot of the loop circuit according to the first embodiment of the present technology. The Bode plot is a graph on which gain and phase with respect to each frequency obtained from the transfer function illustrated in Formula 1 are plotted, and includes a gain diagram indicating gain characteristic and a phase diagram indicating phase characteristic. The letter a in the drawing indicates a gain diagram of the Bode plot generated on the basis of Formula 1, and the letter b in the drawing is a phase diagram of the Bode plot. Furthermore, the vertical axis of a in the drawing indicates a gain of the loop circuit, and the horizontal axis indicates the frequency. The vertical axis of b in the drawing indicates the phase, and the horizontal axis indicates the frequency.

Then, the one-dot chain line curve indicates characteristic of a case where the illuminance is relatively high, and the solid line curve indicates characteristic of a case where the illuminance is medium. The dotted line curve indicates characteristic of a case where the illuminance is relatively low. According to the Bode plot, pole splitting is sufficient for the low illuminance and the high illuminance, such that the system is stable. Meanwhile, for the medium illuminance, the two poles are close such that the phase margin is deteriorated to about 30 degrees. Here, the phase margin indicates a difference between −180 degrees and a phase corresponding to the frequency at which the gain of the loop circuit becomes 0 decibels (dB). A larger phase margin is assessed to be a high stability. Thus, in a case of a quadratic system and where a pole arrangement largely varies with illuminance, it is necessary to take into consideration the stability across the entire range of use case assumed. In the quadratic system, the number of roots (poles) of a transfer function of a quadratic function as illustrated in Formula 1 is two. When they are close to each other, the phase margin becomes smaller, there is a tendency to be unstable.

There are two conceivable methods to stabilize the loop circuit as described below. The first method is that the pole of the cathode terminal side of the photodiode 221 is arranged in a sufficiently high range such that the cathode terminal side is designed to be a main pole under any illuminance of low illuminance to high illuminance. For this purpose, it is necessary to increase bias current of the current source transistor 313 constituting the inverting amplifier and reduce $R_O$ of Formula 1. With this method, an increase in bias current increases power consumption. As an example, in a Bode plot, the pole of the output terminal side of the loop circuit is present near several tens of kilohertz (kHz), whereas the pole of the cathode terminal side under high illuminance is moved to a vicinity of several megahertz (MHz). Therefore, when it is attempted to obtain sufficient pole splitting under every illuminance, it is necessary to increase the bias current on the inverting amplifier side about 1000 times. In many cases, such an increase in power consumption would not be permissible.

The second method is that, as illustrated in FIG. 7, the capacitance (e.g., capacitor 312) is provided. A transfer function taking into account an open loop gain of the loop circuit including the capacitance is expressed by the following formula on the basis of the assumption that capacitance value $C_c$ of the capacitance is smaller than a parasitic capacitance attached to the output terminal:

[Mathematical 2]

$$T_{open}(s) \approx \frac{G_m R_O(g_m + sC_C)}{\{g_m + s(C_{pd} + C_C)\}(1 + sC_O R_O)} \quad \text{Formula 2}$$

Furthermore, between $C_c$ and $C_0$, the relationship formula described below is established. This relationship is a reasonable assumption in design.

$$C_c \ll C_0 \quad \text{Formula 3}$$

According to Formula 2, it can be seen that the addition of the capacitance provides a zero point at the position of $g_m/C_c$. The position of the zero point is proportional to $g_m$ and depends on illuminance. Therefore, in consideration of the relationship with respect to the pole depending on corresponding illuminance (i.e., pole of $g_m/C_{pd}+C_c$), when $C_c$ is designed to a value with which the capacitance value $C_c$ is not largely deviated from Cpd+Cc, the stability can be ensured under every illuminance condition. Note that the capacitance value Cc is preferably in a range of $C_{pd}/3$ to $C_{pd}/2$.

Meanwhile, demerits of addition of the capacitance include a reduction in response speed because the capacitance is added in parallel when viewed from the photodiode 221 and a slew rate, which can be more problematic than small signal characteristic. Regarding this problem, the cathode terminal of the photodiode 221 is maintained at a certain potential during operation for virtual ground point, whereas the output terminal side of the loop circuit indicates a logarithmic response with respect to the illuminance. If a change from the high illuminance to the low illuminance occurs, the output terminal is changed in a direction in which the voltage is reduced. A rapid change at this time is subject to limitations of slew rate determined by $I_{photo}/Cc$ where photocurrent is $I_{photo}$. Thus, there is a possibility that response is considerably slower than the response speed determined by the pole depending on the sensitivity of the photodiode 221 or the amount of light in dark place.

Accordingly, for characteristic improvements, it is significant to preliminarily delete the original capacitance of the photodiode 221 as much as possible and ensure stability using the minimally required capacitance. The size required for the capacitance value $C_c$ is about 0.1 to 10 femtofarads (fF) although it is proportional to the pixel size.

[Configuration Example of Subtractor and Quantizer]

Figure 9:
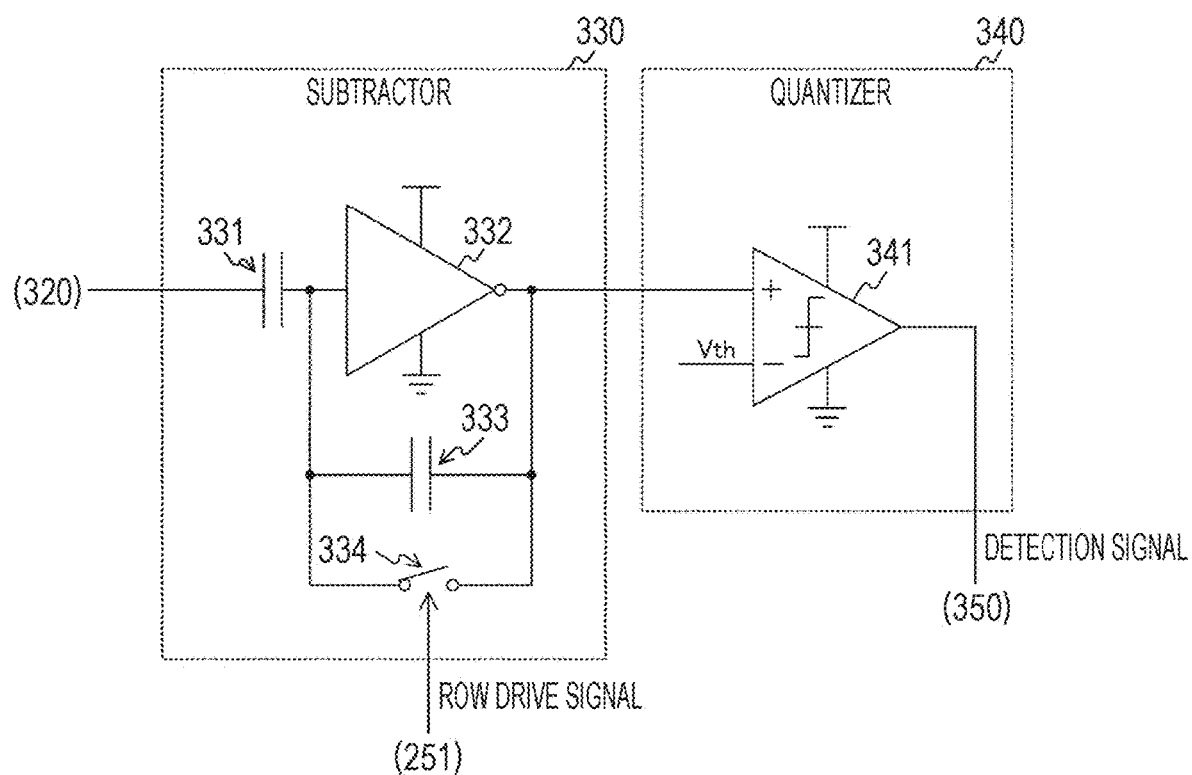
FIG. 9 is a circuit diagram illustrating a configuration example of a subtractor and a quantizer according to the first embodiment of the present technology.

FIG. 9 is a circuit diagram illustrating a configuration example of the subtractor 330 and the quantizer 340 according to the first embodiment of the present technology. The subtractor 330 includes capacitors 331 and 333, an inverter 332, and a switch 334. Furthermore, the quantizer 340 includes a comparator 341.

The capacitor 331 has one end connected to the output terminal of the buffer 320 and the other end connected to the input terminal of the inverter 332. The capacitor 333 is connected to the inverter 332 in parallel. The switch 334 opens/closes a path connecting both ends of the capacitor 333 according to the row drive signal.

The inverter 332 inverts the voltage signal input via the capacitor 331. The inverter 332 outputs the inverted signal to a non-inversion input terminal (+) of the comparator 341.

When the switch 334 is turned on, voltage $V_{init}$ is input to the buffer 320 side of the capacitor 331, and the opposite side becomes a virtual ground terminal. The potential of the virtual ground terminal is zero for the sake of convenience. At this time, charge $Q_{init}$ stored in the capacitor 331 is expressed by the formula described below where the capacitance value of the capacitor 331 is C1. Meanwhile, because both ends of the capacitor 333 are shorted, the stored charge is zero.

$$Q_{init}=C1\times V_{init} \quad \text{Formula 4}$$

Next, when it is considered that the switch 334 is turned off, and the voltage on the buffer 320 side of the capacitor 331 has changed to $V_{after}$, charge $Q_{after}$ stored in the capacitor 331 is expressed by the following formula:

$$Q_{after}=C1\times V_{after} \quad \text{Formula 5}$$

Meanwhile, charge Q2 stored in the capacitor 333 is expressed by the formula described below where the capacitance value of the capacitor 333 is C2 and the output voltage is $V_{out}$.

$$Q2=-C2\times V_{out} \quad \text{Formula 6}$$

At this time, because the total charge amount of the capacitors 331 and 333 is not changed, the formula described below is established.

$$Q_{init}=Q_{after}+Q2 \quad \text{Formula 7}$$

When Formulas 4 to 6 are inserted into Formula 7 to modify Formula 7, the formula described below is obtained.

$$V_{out}=-(C1/C2)\times(V_{after}-V_{init}) \quad \text{Formula 8}$$

Formula 8 indicates subtraction operation of the voltage signal, and the gain of the subtraction result is C1/C2. Normally, because the gain is desirably maximized, it is preferable that the capacitance value C1 be designed to be larger and the capacitance value C2 be designed to be smaller. Meanwhile, when the C2 is too small, kTC noise increases, thereby possibly deteriorating the noise characteristic. Therefore, the elimination of the capacitance of C2 is limited to a noise permissible range. Furthermore, because the address event detection circuit 300 including the subtractor 330 is mounted with respect to each pixel, the capacitance value C1 or C2 is subject to area restrictions. Similar to the capacitance value Cc, regarding the capacitance values C1 and C2, although a possible range varies in proportion to the pixel size, for example, the capacitance value C1 is set to a value of 20 to 200 femtofarads (fF) in normal design. The capacitance value C2 is set to a value of 1 to 20 femtofarads (fF).

The comparator 341 compares the voltage signal from the subtractor 330 with predetermined threshold voltage Vth applied to the inversion input terminal (−). The comparator 341 outputs a signal indicating the result of the comparison to the transfer circuit 350 as a detection signal.

Note that although the capacitors 331 and 333 are provided as capacitive elements, a wire capacitance, a transistor, or the like may be provided instead of them. Furthermore, the capacitor 331 is an example of the first capacitance in the claims, and the capacitor 333 is an example of the second capacitance in the claims.

Furthermore, the type of the capacitive element of the capacitance value C1 and the type of the capacitive element of the capacitance value C2 are desirably the same because the relative precision has influence on the characteristic. Meanwhile, the type of the capacitive element of the capacitance value $C_c$ and the type of the capacitive element of the capacitance values C1 and C2 may be different. For example, interwiring capacitance may be used as the capacitive element of the capacitance value $C_c$, and a capacitor may be used as the capacitive element of the capacitance values C1 and C2.

Figure 10:
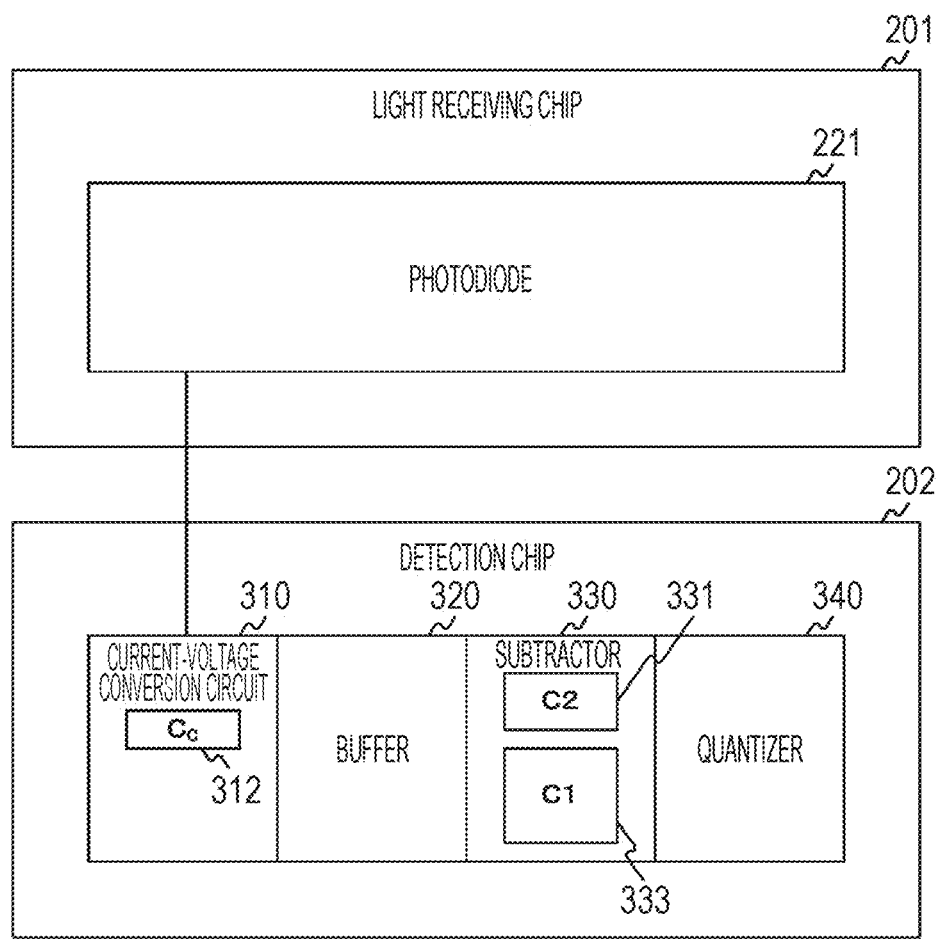
FIG. 10 is a diagram illustrating an example of a circuit provided on each of a light receiving chip and a detection chip according to the first embodiment of the present technology.

FIG. 10 is a diagram illustrating an example of a circuit provided in the light receiving chip 201 and the detection chip 202 according to the first embodiment of the present technology. The photodiode 221 is arranged on the light receiving chip 201, and the current-voltage conversion circuit 310, the buffer 320, the subtractor 330, and the quantizer 340 are arranged on the detection chip 202.

It is desirable that the capacitance value $C_c$ of the capacitor 312 in the current-voltage conversion circuit 310 and the capacitance values C1 and C2 of the capacitors 331 and 333 in the subtractor 330 satisfy any of the formulas described below.

$$C_c < C2 < C1$$

$$C2 < C_c < C1$$

Thus, because the capacitor 312 is connected between the gate and the source of the conversion transistor 311 in the first embodiment of the present technology, it is possible to compensate the phase delay of the voltage signal. Thus, it is possible to increase the stability of the current-voltage conversion circuit 310 including the conversion transistor 311.

2. Second Embodiment

In the aforementioned first embodiment, the capacitor 312 is used as the capacitance in the current-voltage conversion circuit 310. However, the mounting area of the capacitor 312 is larger than that of the other capacitive elements, and therefore there is a possibility that the mounting area of the entire solid-state imaging element 200 increases. The current-voltage conversion circuit 310 of the second embodiment differs from that of the first embodiment in that the current-voltage conversion circuit 310 uses the interwiring capacitance.

Figure 11:
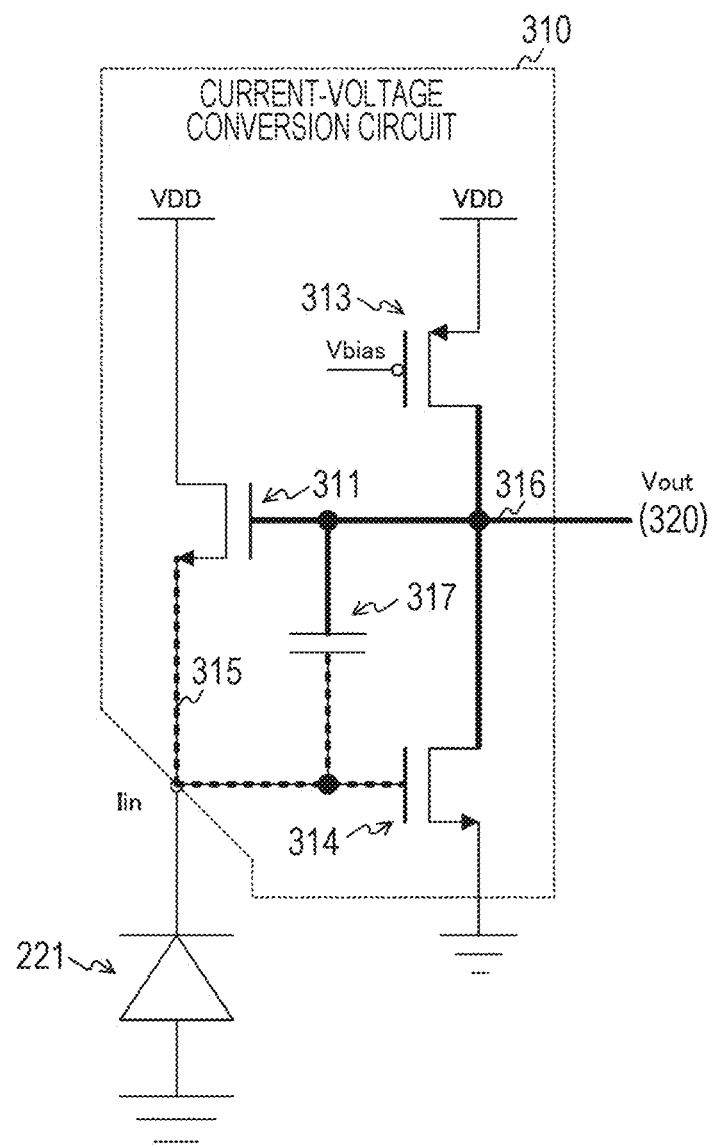
FIG. 11 is a circuit diagram illustrating a configuration example of a current-voltage conversion circuit according to a second embodiment of the present technology.

FIG. 11 is a circuit diagram illustrating a configuration example of the current-voltage conversion circuit 310 according to the second embodiment of the present technology. The current-voltage conversion circuit 310 of the second embodiment differs from that of the first embodiment in that the current-voltage conversion circuit 310 includes an interwiring capacitance 317 instead of the capacitor 312.

Figure 12:
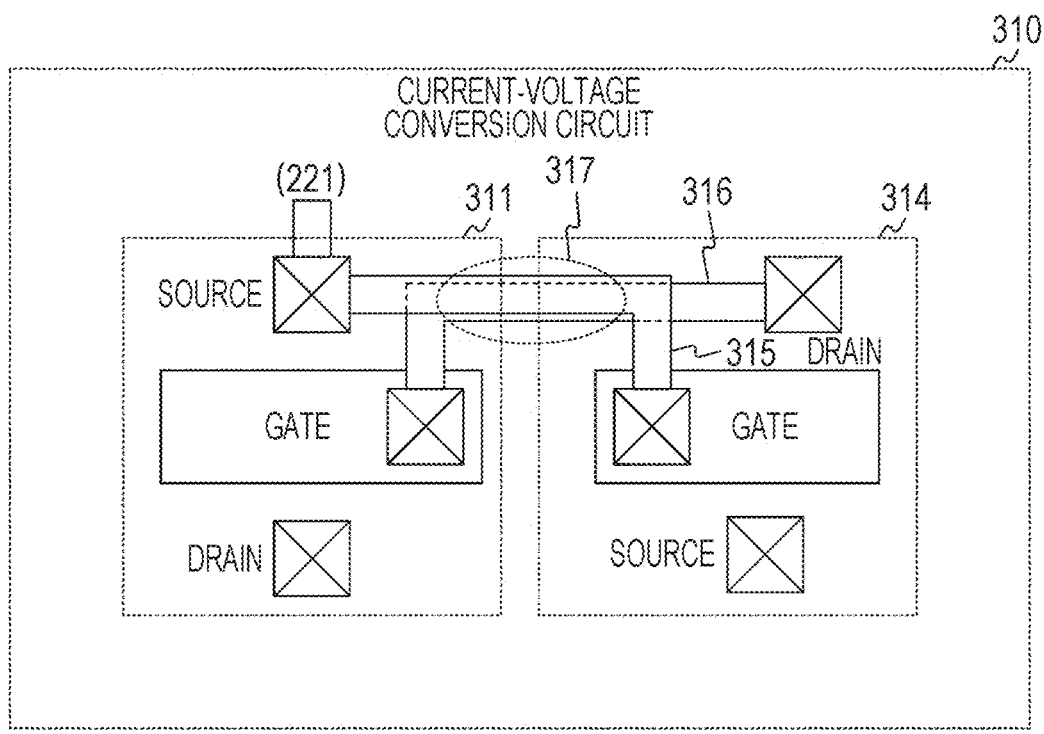
FIG. 12 is a diagram illustrating an example of a wiring layout of the current-voltage conversion circuit according to the second embodiment of the present technology.

FIG. 12 is a diagram illustrating an example of a wiring layout of the current-voltage conversion circuit 310 according to the second embodiment of the present technology. In the drawing, the current source transistor 313 is omitted.

Furthermore, the input signal line 315 and the output signal line 316 are wired to different wiring layers. For example, with a direction from the detection chip 202 to the light receiving chip 201 defined as an upward direction, the output signal line 316 is wired to the lower side of the stacked two wiring layers and the input signal line 315 is wired to the upper side. Note that the up-and-down relationship of the input signal line 315 and the output signal line 316 may be reversed.

Then, the input signal line 315 and the output signal line 316 are partially crossed. At this crossing portion, the input signal line 315 and the output signal line 316 are wired along a predetermined direction parallel to the chip surface of the detection chip 202, and the interwiring capacitance 317 between these signal lines is used as the capacitance. The capacitance value $C_c$ is determined by the length of the crossing portion. For example, the length of the crossing portion is set to 200 nanometers (nm) or more.

Thus, because the interwiring capacitance 317 is used in the second embodiment of the present technology, the mounting area of the solid-state imaging element 200 can be reduced as compared with the case where the capacitor 312 is used.

3. Third Embodiment

In the aforementioned second embodiment, in the current-voltage conversion circuit 310, the interwiring capacitance 317 between the input signal line 315 and the output signal line 316 wired respectively to the two stacked wiring layers is used. However, because it is necessary to stack the two wiring layers, there is a possibility that the manufacturing man-hour increases as compared with the case where stacking is not performed. The current-voltage conversion circuit 310 of the third embodiment differs from that of the second embodiment in that the input signal line 315 and the output signal line 316 are wired to the same wiring layer.

Figure 13:
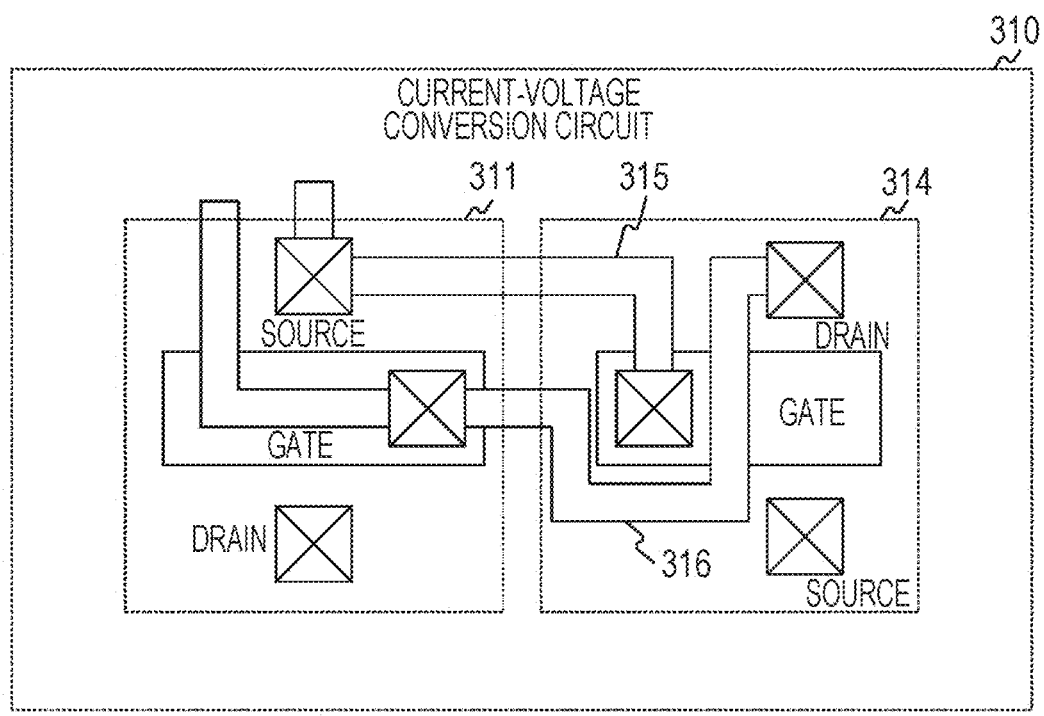
FIG. 13 is a diagram illustrating an example of a wiring layout of a current-voltage conversion circuit according to a third embodiment of the present technology.

FIG. 13 is a diagram illustrating an example of a wiring layout of the current-voltage conversion circuit 310 according to the third embodiment of the present technology. The current-voltage conversion circuit 310 of the third embodiment differs from that of the second embodiment in that the input signal line 315 and the output signal line 316 are wired to the same wiring layer. For example, the input signal line 315 and the output signal line 316 are wired side by side, and the output signal line 316 is wired to be longer than the input signal line 315 to surround the input signal line 315.

Thus, because in the third embodiment of the present technology, the input signal line 315 and the output signal line 316 are wired to the same wiring layer, the manufacturing man-hour for the wiring layer can be reduced as compared with the case where wiring is performed in the stacked two wiring layers.

4. Fourth Embodiment

In the aforementioned first embodiment, the capacitor 312 is used as the capacitance in the current-voltage conversion circuit 310. However, the mounting area of the capacitor 312 is larger than that of the other capacitive elements, and therefore there is a possibility that the mounting area of the entire solid-state imaging element 200 increases. The current-voltage conversion circuit 310 of the fourth embodiment differs from that of the first embodiment in that the current-voltage conversion circuit 310 uses the gate capacitance of the transistor.

Figure 14:
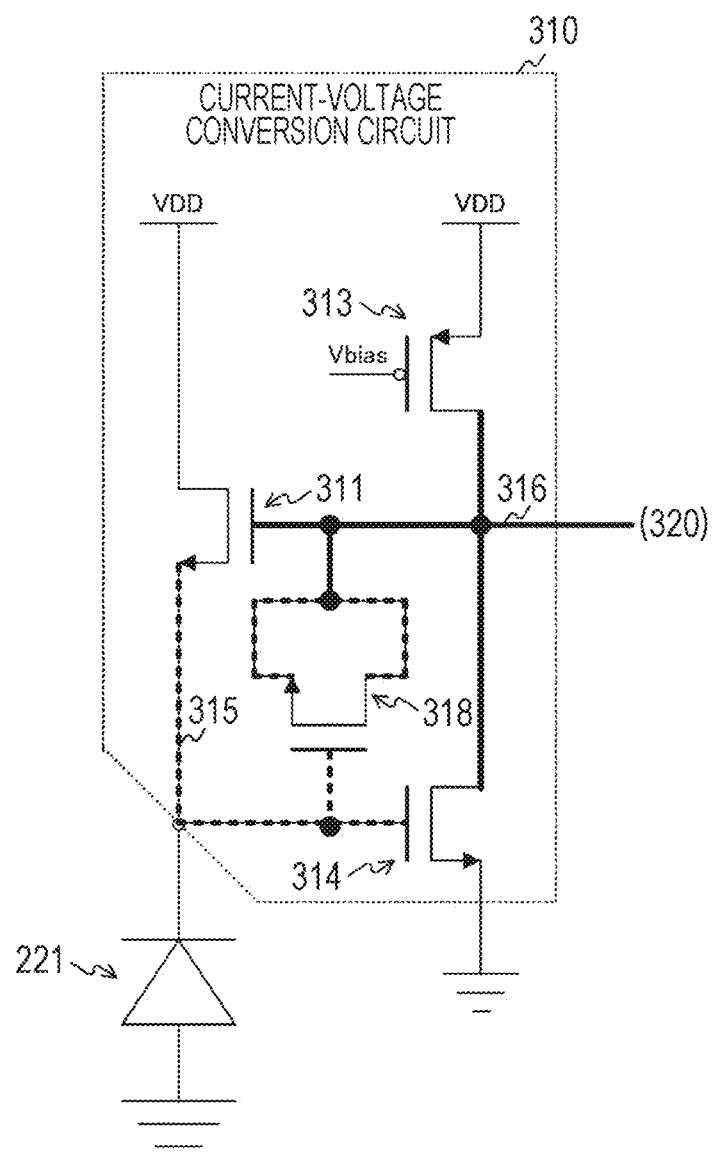
FIG. 14 is a circuit diagram illustrating a configuration example of a current-voltage conversion circuit according to a fourth embodiment of the present technology.

FIG. 14 is a circuit diagram illustrating a configuration example of the current-voltage conversion circuit 310 according to the fourth embodiment of the present technology. The current-voltage conversion circuit 310 of the fourth embodiment differs from that of the first embodiment in that the current-voltage conversion circuit 310 includes a transistor 318 instead of the capacitor 312.

As the transistor 318, for example, an N-type MOS transistor is used. The gate of the transistor 318 is connected to the input signal line 315. Furthermore, the source and the drain of the transistor 318 are connected to the output signal line 316. The gate capacitance of the transistor 318 functions as a phase compensation capacitance.

Figure 15:
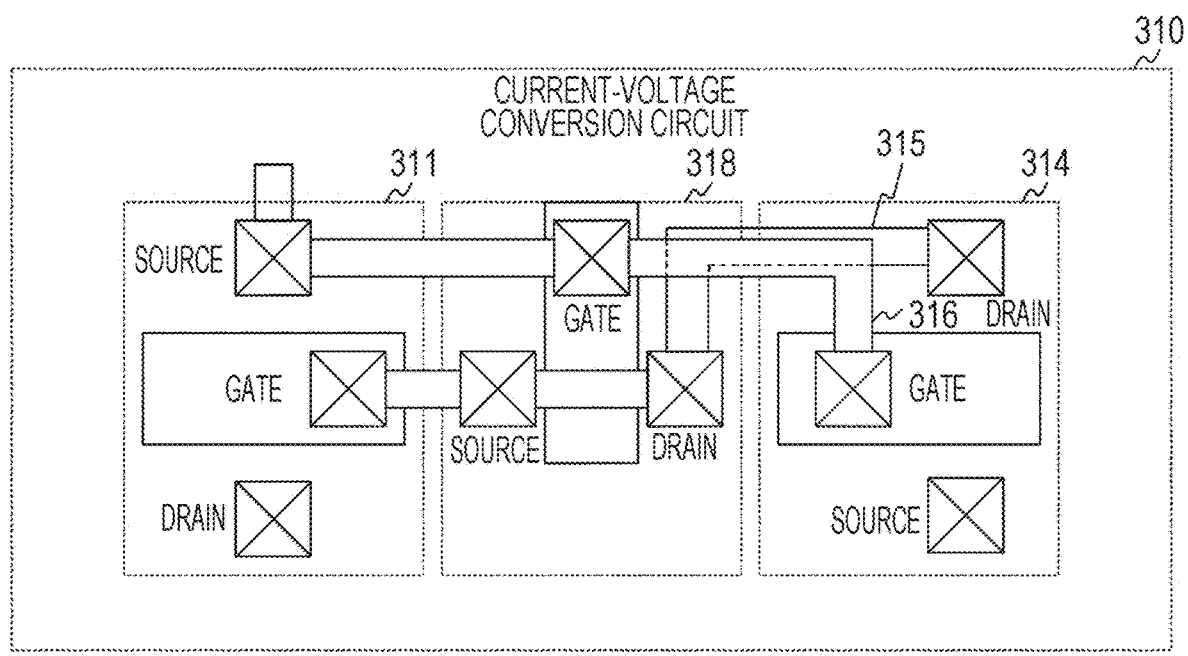
FIG. 15 is a diagram illustrating an example of a wiring layout of a current-voltage conversion circuit according to the fourth embodiment of the present technology.

FIG. 15 is a diagram illustrating an example of a wiring layout of the current-voltage conversion circuit 310 according to the fourth embodiment of the present technology. The input signal line 315 is connected to the gate of the transistor 318 because the characteristic may be deteriorated by leak current. Meanwhile, the output signal line 316 is connected to the source and the drain of the transistor 318.

Thus, because the gate capacitance of the transistor 318 is used as the capacitance in the fourth embodiment of the present technology, as compared with the case where the capacitor is used, the mounting area of the solid-state imaging element 200 can be reduced.

5. Fifth Embodiment

In the aforementioned first embodiment, the current-voltage conversion circuit 310 is entirely arranged on the detection chip 202. However, there is a possibility that the circuit scale of the circuit in the detection chip 202 increases due to an increase in the number of pixels. The solid-state imaging element 200 of the fifth embodiment differs from that of the first embodiment in that a partial circuit of the current-voltage conversion circuit 310 is provided on the light receiving chip 201.

Figure 16:
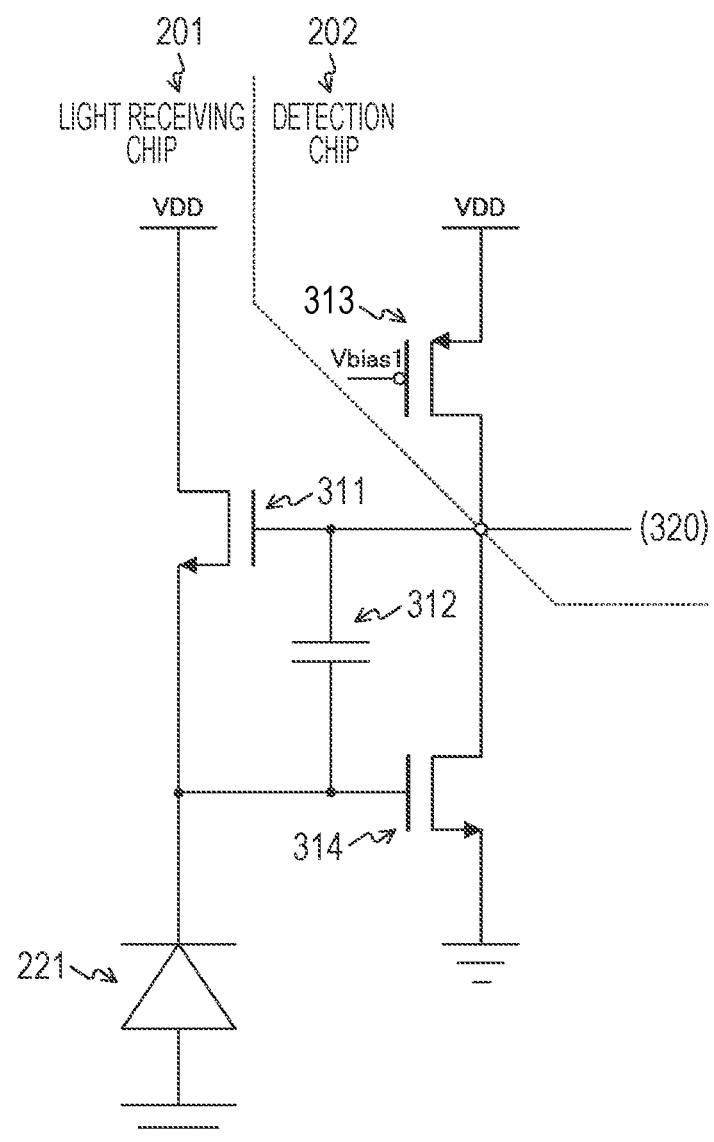
FIG. 16 is a circuit diagram illustrating a configuration example of a current-voltage conversion circuit according to a fifth embodiment of the present technology.

FIG. 16 is a circuit diagram illustrating an example of a circuit provided on each of the light receiving chip 201 and the detection chip 202 according to a variation example of the first embodiment of the present technology. As illustrated in the drawing, the light receiving chip 201 further includes, in addition to the photodiode 221, an N-type conversion transistor 311, an N-type voltage supply transistor 314, and the capacitor 312. Meanwhile, the detection chip 202 includes a P-type current source transistor 313 and a subsequent circuit.

The N-type conversion transistor 311, the N-type voltage supply transistor 314, and the capacitor 312 are arranged on the light receiving chip 201. Thus, the circuit scale of the detection chip 202 can be reduced for such elements. Furthermore, when the transistors in the light receiving chip 201 are all of an N-type, the number of processes for forming the transistors can be reduced as compared with the case where both the N-type transistor and the P-type transistor are present. Thus, the manufacturing cost for the light receiving chip 201 can be reduced.

Note that, also in the fifth embodiment, similar to the second and third embodiments, the interwiring capacitance can be used. Furthermore, also in the fifth embodiment, similar to the fourth embodiment, the gate capacitance of the transistor can be used.

Thus, in the fifth embodiment of the present technology, the N-type conversion transistor 311 and the N-type voltage supply transistor 314 are arranged on the light receiving chip 201. Therefore, the manufacturing cost and the circuit scale of the detection chip 202 can be reduced.

6. Sixth Embodiment

In the aforementioned first embodiment, the subtractor 330 is entirely arranged on the detection chip 202. However, there is a possibility that the circuit scale or the mounting area of the circuit in the detection chip 202 increases due to an increase in the number of pixels. The solid-state imaging element 200 of the sixth embodiment differs from that of the first embodiment in that the subtractor 330 is partially provided on the light receiving chip 201.

Figure 17:
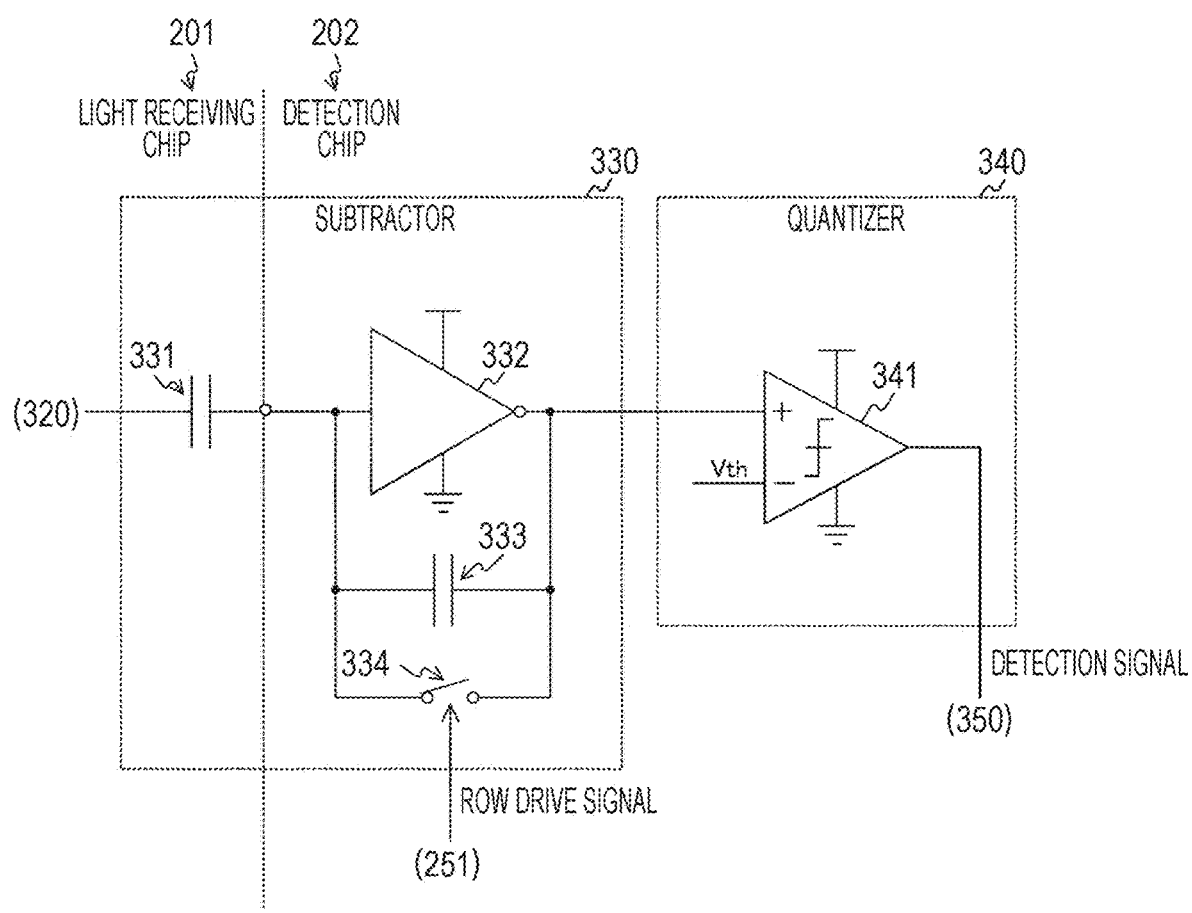
FIG. 17 is a diagram illustrating an example of a circuit provided on each of a light receiving chip and a detection chip according to a sixth embodiment of the present technology.

FIG. 17 is a circuit diagram illustrating an example of a circuit provided on each of the light receiving chip 201 and the detection chip 202 according to the sixth embodiment of the present technology.

On the light receiving chip 201, the current-voltage conversion circuit 310 and the buffer 320, and the capacitor 331 in the subtractor 330 are arranged.

Meanwhile, on the detection chip 202, the inverter 332, the capacitor 333, and the switch 334 in the subtractor 330 are arranged.

A capacitor such as the capacitors 331 and 333 generally has a larger mounting area than a transistor, a diode, or the like. When the capacitor 331 and the capacitor 333 are arranged on the light receiving chip 201 and the detection chip 202 in a distributed manner, the mounting area of the entire circuit can be reduced.

Note that, also in the sixth embodiment, similar to the second and third embodiments, the interwiring capacitance can be used. Furthermore, also in the sixth embodiment, similar to the fourth embodiment, the gate capacitance of the transistor can be used.

Thus, in the sixth embodiment of the present technology, the capacitor 331 is arranged on the light receiving chip 201 and the capacitor 333 is arranged on the detection chip 202. Therefore, the mounting area can be reduced as compared with the case where they are provided on the same chip.

7. Seventh Embodiment

In the aforementioned first embodiment, the current-voltage conversion circuit 310 is arranged on the detection chip 202. However, there is a possibility that the circuit scale of the circuit in the detection chip 202 increases due to an increase in the number of pixels. The solid-state imaging element 200 of the seventh embodiment differs from that of the first embodiment in that the current-voltage conversion circuit 310 is provided on the light receiving chip 201.

Figure 18:
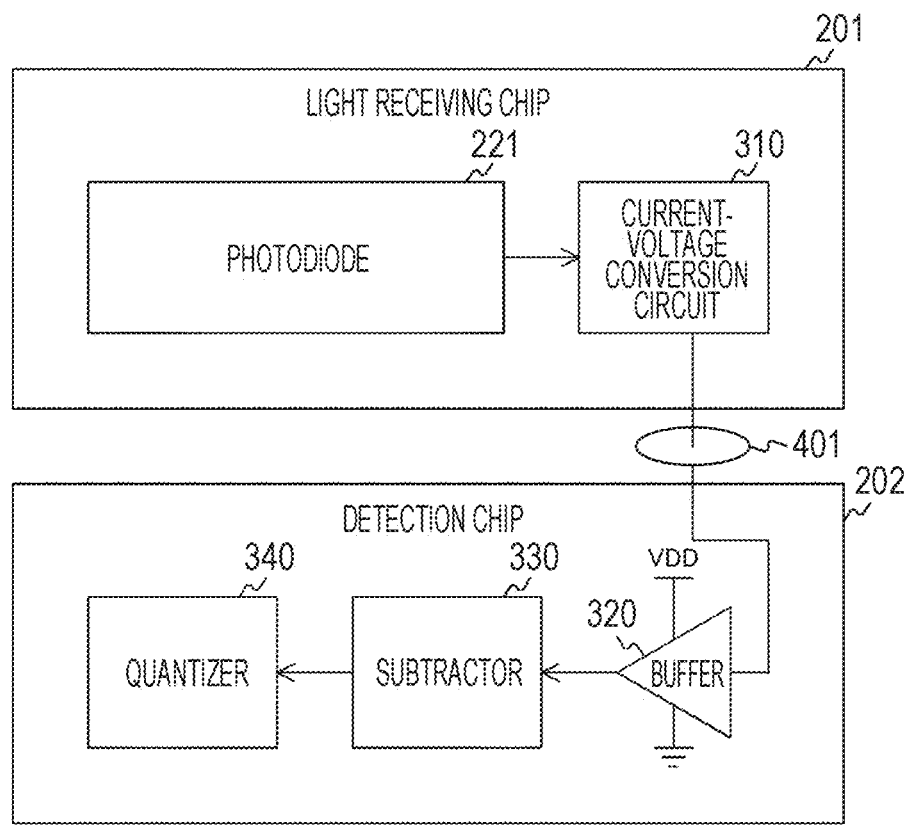
FIG. 18 is a diagram illustrating an example of a circuit provided on each of a light receiving chip and a detection chip according to a seventh embodiment of the present technology.

FIG. 18 is a circuit diagram illustrating an example of a circuit provided on each of the light receiving chip 201 and the detection chip 202 according to the seventh embodiment of the present technology.

On the light receiving chip 201, the current-voltage conversion circuit 310 is further provided. Meanwhile, on the detection chip 202, the circuits after the buffer 320 are provided.

Furthermore, a shield 401 is arranged between the light receiving chip 201 and the detection chip 202. The shield 401 is arranged immediately below the current-voltage conversion circuit 310, and a signal line connecting the current-voltage conversion circuit 310 and buffer 320 is wired to extend through the shield 401. As the shield 401, for example, an electromagnetic shield is used. The arrangement of the shield 401 can suppress electromagnetic noise. Furthermore, the shape of the shield 401 is, for example, circle. Note that the shape of the shield 401 may be other than circle.

Note that, in addition to the shield 401, a shield may be further arranged immediately above the quantizer 340 or the subtractor 330. Furthermore, also in the seventh embodiment, similar to the second and third embodiments, the interwiring capacitance can be used. Furthermore, also in the seventh embodiment, similar to the fourth embodiment, the gate capacitance of the transistor can be used.

Thus, in the seventh embodiment of the present technology, the current-voltage conversion circuit 310 is arranged on the light receiving chip 201. Therefore, the circuit scale of the detection chip 202 can be reduced as compared with the case where the circuit is provided on the detection chip 202.

8. Eighth Embodiment

In the seventh embodiment, the buffer 320 is arranged on the detection chip 202. However, there is a possibility that the circuit scale of the circuit in the detection chip 202 increases due to an increase in the number of pixels. The solid-state imaging element 200 of the eighth embodiment differs from that of the seventh embodiment in that the buffer 320 is provided on the light receiving chip 201.

Figure 19:
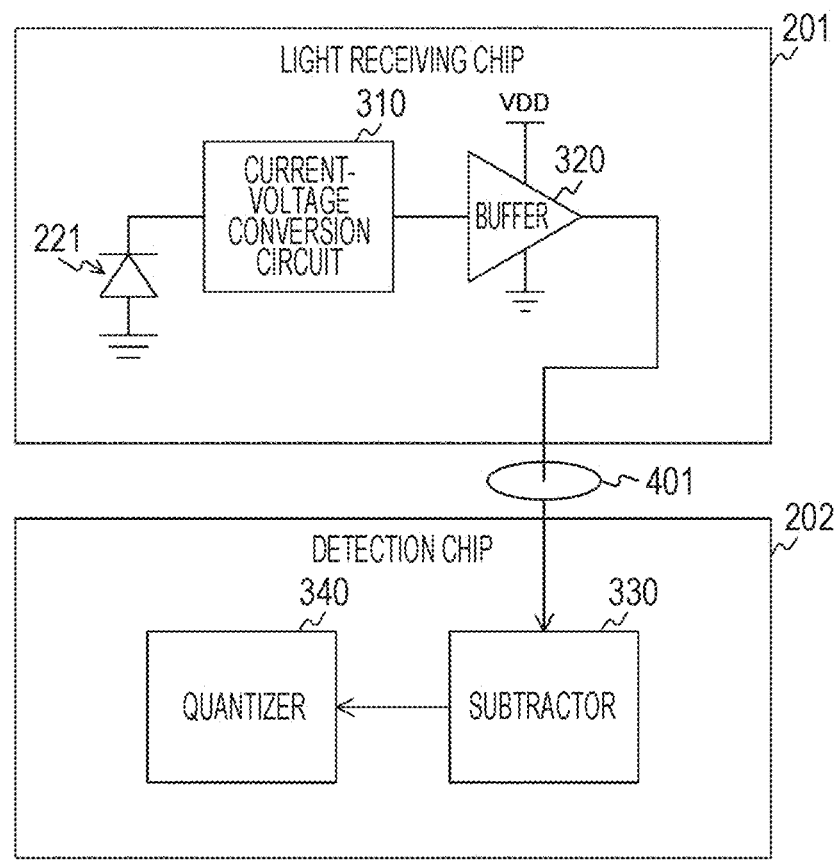
FIG. 19 is a diagram illustrating an example of a circuit provided on each of a light receiving chip and a detection chip according to an eighth embodiment of the present technology.

FIG. 19 is a circuit diagram illustrating an example of a circuit provided on each of the light receiving chip 201 and the detection chip 202 according to the eighth embodiment of the present technology.

The buffer 320 is further provided on the light receiving chip 201. Meanwhile, on the detection chip 202, the circuits after the subtractor 330 are provided.

Furthermore, the shield 401 is arranged immediately below the buffer 320, and a signal line connecting the buffer 320 and the subtractor 330 is wired to extend through the shield 401.

Note that, also in the eighth embodiment, similar to the second and third embodiments, the interwiring capacitance can be used. Furthermore, also in the eighth embodiment, similar to the fourth embodiment, the gate capacitance of the transistor can be used.

Furthermore, the stack structure of the solid-state imaging element 200 is not limited to the configurations illustrated in the first to eighth embodiments. For example, the circuits after the quantizer 340 may be arranged on the detection chip 202 and the other circuits may be arranged on the light receiving chip 201.

Thus, in the eighth embodiment of the present technology, the buffer 320 is arranged on the light receiving chip 201. Therefore, the circuit scale of the detection chip 202 can be reduced as compared with the case where the circuit is provided on the detection chip 202.

<9. Application Example to Mobile Body>

The technology according to the present disclosure (present technology) is applicable to a variety of products. For example, the technology according to the present disclosure may be implemented as devices mounted on any type of movable bodies such as automobiles, electric vehicles, hybrid electric vehicles, motorcycles, bicycles, personal mobilities, airplanes, drones, ships, robots.

Figure 20:
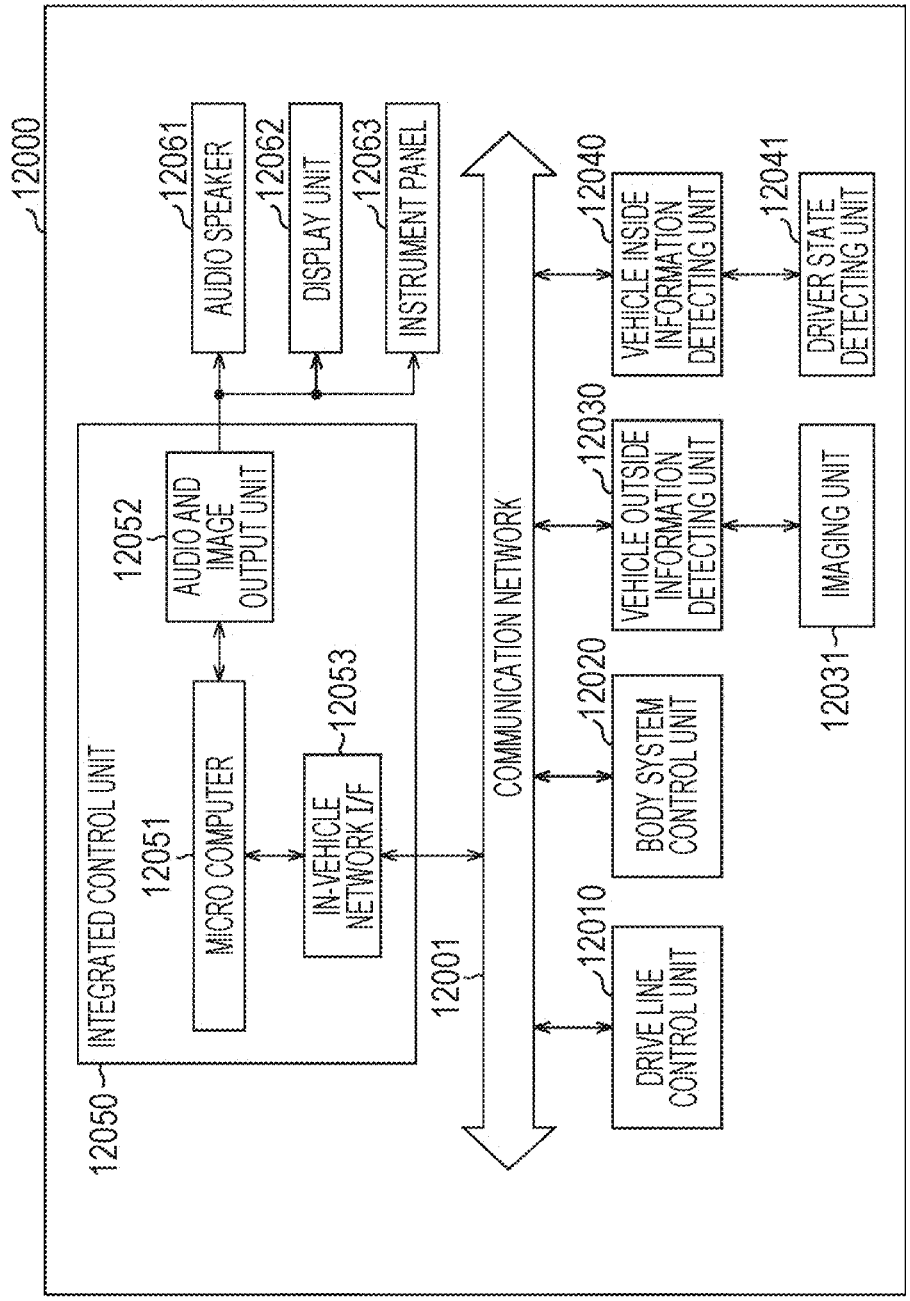
FIG. 20 is a block diagram illustrating a schematic configuration example of a vehicle control system.

FIG. 20 is a block diagram illustrating a schematic configuration example of a vehicle control system, which is an example of a movable body control system to which the technology according to the present disclosure can be applied.

The vehicle control system 12000 includes a plurality of electronic control units connected via a communication network 12001. In the example illustrated in FIG. 20, the vehicle control system 12000 includes a drive line control unit 12010, a body system control unit 12020, a vehicle outside information detecting unit 12030, a vehicle inside information detecting unit 12040, and an integrated control unit 12050. Furthermore, a microcomputer 12051, an audio and image output unit 12052, and an in-vehicle network interface (I/F) 12053 are illustrated as functional configurations of the integrated control unit 12050.

The drive line control unit 12010 controls the operation of devices related to the drive line of the vehicle in accordance with a variety of programs. For example, the drive line control unit 12010 functions as a control device for a driving force generating device such as an internal combustion engine or a driving motor that generates the driving force of the vehicle, a driving force transferring mechanism that transfers the driving force to wheels, a steering mechanism that adjusts the steering angle of the vehicle, a braking device that generates the braking force of the vehicle, and the like.

The body system control unit 12020 controls the operations of a variety of devices attached to the vehicle body in accordance with a variety of programs. For example, the body system control unit 12020 functions as a control device for a keyless entry system, a smart key system, a power window device, or a variety of lights such as a headlight, a backup light, a brake light, a blinker, or a fog lamp. In this case, the body system control unit 12020 can receive radio waves transmitted from a portable device that serves instead of the key or signals of a variety of switches. The body system control unit 12020 accepts input of these radio waves or signals, and controls the vehicle door lock device, the power window device, the lights, or the like.

The vehicle outside information detecting unit 12030 detects information regarding the outside of the vehicle including the vehicle control system 12000. For example, the imaging unit 12031 is connected to the vehicle outside information detecting unit 12030. The vehicle outside information detecting unit 12030 causes the imaging unit 12031 to capture images of the outside of the vehicle, and receives the captured image. The vehicle outside information detecting unit 12030 may perform processing of detecting an object such as a person, a car, an obstacle, a traffic sign, or a letter on a road, or processing of detecting the distance on the basis of the received image.

The imaging unit 12031 is an optical sensor that receives light and outputs an electric signal corresponding to the amount of received light. The imaging unit 12031 can output the electric signal as the image or output the electric signal as ranging information. Furthermore, the light received by the imaging unit 12031 may be visible light or invisible light such as infrared light.

The vehicle inside information detecting unit 12040 detects information of the inside of the vehicle. The vehicle inside information detecting unit 12040 is connected, for example, to a driver state detecting unit 12041 that detects the state of the driver. The driver state detecting unit 12041 includes, for example, a camera that images a driver, and the vehicle inside information detecting unit 12040 may compute the degree of the driver's tiredness or the degree of the driver's concentration or determine whether nor not the driver has a doze, on the basis of detection information input from the driver state detecting unit 12041.

The microcomputer 12051 can calculate a control target value of the driving force generating device, the steering mechanism, or the braking device on the basis of information regarding the inside and outside of the vehicle acquired by the vehicle outside information detecting unit 12030 or the vehicle inside information detecting unit 12040, and output a control instruction to the drive line control unit 12010. For example, the microcomputer 12051 can perform cooperative control for the purpose of executing the functions of the advanced driver assistance system (ADAS) including vehicle collision avoidance or impact reduction, follow-up driving based on the inter-vehicle distance, constant vehicle speed driving, vehicle collision warning, vehicle lane deviation warning, or the like.

Furthermore, the microcomputer 12051 can perform cooperative control for the purpose of automatic driving or the like for autonomous running without depending on the driver's operation through control of the driving force generating device, the steering mechanism, the braking device, or the like on the basis of information around the vehicle acquired by the vehicle outside information detecting unit 12030 or the vehicle inside information detecting unit 12040.

Furthermore, the microcomputer 12051 can output a control instruction to the body system control unit 12020 on the basis of the information outside the vehicle obtained by the vehicle outside information detecting unit 12030. For example, the microcomputer 12051 can perform the cooperative control for realizing glare protection such as controlling the head light according to a position of a preceding vehicle or an oncoming vehicle detected by the vehicle outside information detecting unit 12030 to switch a high beam to a low beam.

The audio and image output unit 12052 transmits an output signal of at least one of a sound or an image to an output device capable of visually or aurally notifying a passenger of the vehicle or the outside of the vehicle of information. In the example of FIG. 20, an audio speaker 12061, a display unit 12062, and an instrument panel 12063 are exemplified as the output device. For example, the display unit 12062 may include at least one of an onboard display or a head-up display.

Figure 21:
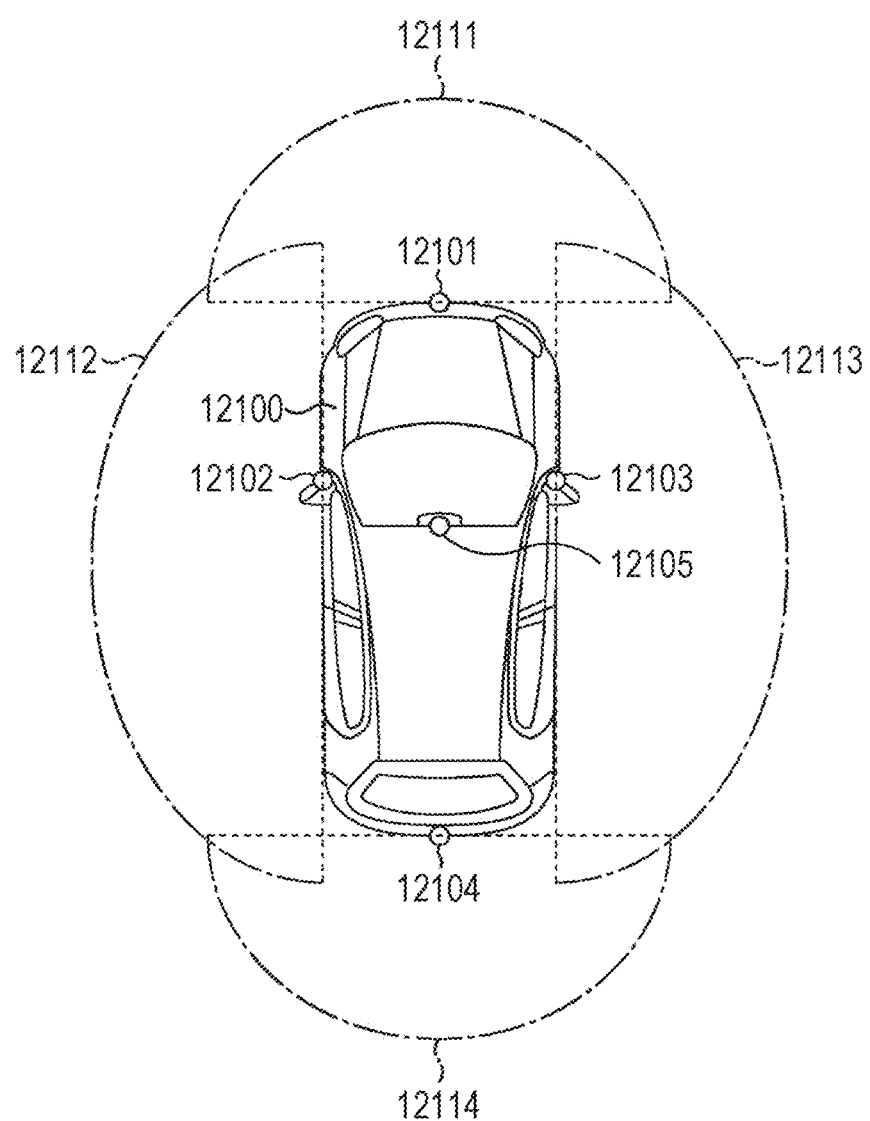
FIG. 21 is an explanatory view illustrating an example of an installation position of an imaging unit.

FIG. 21 is a view illustrating an example of an installation position of the imaging unit 12031.

In FIG. 21, imaging units 12101, 12102, 12103, 12104, and 12105 are provided as the imaging unit 12031.

Imaging units 12101, 12102, 12103, 12104 and 12105 are positioned, for example, at the front nose, a side mirror, the rear bumper, the back door, the upper part of the windshield in the vehicle compartment, or the like of a vehicle 12100. The imaging unit 12101 attached to the front nose and the imaging unit 12105 attached to the upper part of the windshield in the vehicle compartment mainly acquire images of the area ahead of the vehicle 12100. The imaging units 12102 and 12103 attached to the side mirrors mainly acquire images of the areas on the sides of the vehicle 12100. The imaging unit 12104 attached to the rear bumper or the back door mainly acquires images of the area behind the vehicle 12100. The imaging unit 12105 attached to the upper part of the windshield in the vehicle compartment is used mainly to detect a preceding vehicle, a pedestrian, an obstacle, a traffic light, a traffic sign, a lane, or the like.

Note that FIG. 21 illustrates an example of the respective imaging ranges of the imaging units 12101 to 12104. An imaging range 12111 represents the imaging range of the imaging unit 12101 attached to the front nose. Imaging ranges 12112 and 12113 respectively represent the imaging ranges of the imaging units 12102 and 12103 attached to the side mirrors. An imaging range 12114 represents the imaging range of the imaging unit 12104 attached to the rear bumper or the back door. For example, overlaying image data captured by the imaging units 12101 to 12104 offers an overhead image that looks down on the vehicle 12100.

At least one of the imaging units 12101 to 12104 may have a function of obtaining distance information. For example, at least one of the imaging units 12101 to 12104 may be a stereo camera including a plurality of imaging elements, or may be an imaging element having pixels for phase difference detection.

For example, the microcomputer 12051 may extract especially a closest three-dimensional object on a traveling path of the vehicle 12100, the three-dimensional object traveling at a predetermined speed (for example, 0 km/h or higher) in a direction substantially the same as that of the vehicle 12100 as the preceding vehicle by determining a distance to each three-dimensional object in the imaging ranges 12111 to 12114 and change in time of the distance (relative speed relative to the vehicle 12100) on the basis of the distance information obtained from the imaging units 12101 to 12104. Moreover, the microcomputer 12051 can set an inter-vehicle distance to be secured in advance from the preceding vehicle, and can perform automatic brake control (including follow-up stop control), automatic acceleration control (including follow-up start control) and the like. In this manner, it is possible to perform the cooperative control for realizing automatic driving or the like to autonomously travel independent from the operation of the driver.

For example, the microcomputer 12051 can extract three-dimensional object data regarding the three-dimensional object while sorting the data into a two-wheeled vehicle, a regular vehicle, a large vehicle, a pedestrian, and other three-dimensional object such as a utility pole on the basis of the distance information obtained from the imaging units 12101 to 12104 and use the data for automatically avoiding obstacles. For example, the microcomputer 12051 discriminates obstacles around the vehicle 12100 into an obstacle visibly recognizable to a driver of the vehicle 12100 and an obstacle difficult to visually recognize. Then, the microcomputer 12051 determines a collision risk indicating a degree of risk of collision with each obstacle, and when the collision risk is higher than a set value and there is a possibility of collision, the microcomputer 12051 can perform driving assistance for avoiding the collision by outputting an alarm to the driver via the audio speaker 12061 and the display unit 12062 or performing forced deceleration or avoidance steering via the drive line control unit 12010.

At least one of the imaging units 12101 to 12104 may be an infrared camera for detecting infrared rays. For example, the microcomputer 12051 can recognize a pedestrian by determining whether or not there is a pedestrian in the captured images of the imaging units 12101 to 12104. Such pedestrian recognition is carried out, for example, by a procedure of extracting feature points in the captured images of the imaging units 12101 to 12104 as infrared cameras and a procedure of performing pattern matching processing on a series of feature points indicating an outline of an object to discriminate whether or not the object is a pedestrian. When the microcomputer 12051 determines that there is a pedestrian in the captured images of the imaging units 12101 to 12104 and recognizes the pedestrian, the audio and image output unit 12052 controls the display unit 12062 to superimpose a rectangular contour for emphasis on the recognized pedestrian. Furthermore, the audio and image output unit 12052 may control the display unit 12062 to display icons or the like indicating pedestrians at desired positions.

An example of the vehicle control system to which the technology according to the present disclosure is applicable is heretofore described. The technology according to the present disclosure can be applied, for example, to the imaging unit 12031 among the configurations described above. Specifically, the imaging apparatus 100 of FIG. 1 can be applied to the imaging unit 12031 of FIG. 20. Application of the technology according to the present disclosure to the imaging unit 12031 can increase the stability of a circuit and the reliability of the vehicle control system.

Note that the embodiments described above are examples for embodying the present technology, and matters in the embodiments each have a corresponding relationship with invention-specifying matters in the claims. Similarly, the invention-specifying matters in the claims each have a corresponding relationship with matters in the embodiments of the present technology denoted by the same names. However, the present technology is not limited to the embodiments, and can be embodied by subjecting the embodiments to various modification in the scope without departing from the spirit.

Furthermore, the processing sequences described in the embodiments described above may be regarded as a method having a series of sequences or may be regarded as a program for causing a computer to execute the series of sequences or a recording medium storing the program. As the recording medium, for example, a Compact Disc (CD), a MiniDisc (MD), and a Digital Versatile Disc (DVD), a memory card, a Blu-ray (registered trademark) disc, and the like can be used.

Note that the effects described in the present description are merely illustrative and are not limitative, and other effects may be provided.

Note that the present technology may be configured as below.

(1)

A solid-state imaging element including:

a photodiode that photoelectrically converts incident light and generates photocurrent;

a conversion transistor that converts the photocurrent to a voltage signal and outputs the voltage signal from a gate;

a current source transistor that supplies predetermined constant current to an output signal line connected to the gate;

a voltage supply transistor that supplies a certain voltage corresponding to the predetermined constant current from the output signal line to a source of the conversion transistor; and a capacitance that is connected between the gate and the source of the conversion transistor.

(2)

The solid-state imaging element according to (1), in which a gate of the voltage supply transistor is connected to the source of the conversion transistor via an input signal line, and the capacitance is an interwiring capacitance between the input signal line and the output signal line.

(3)

The solid-state imaging element according to (2), in which the input signal line and the output signal line are wired to mutually different wiring layers.

(4)

The solid-state imaging element according to (2), in which the input signal line and the output signal line are wired to the same wiring layer.

(5)

The solid-state imaging element according to (1), in which the capacitance is a gate capacitance of a transistor.

(6)

The solid-state imaging element according to any of (1) to (5), further including:

a buffer that corrects the voltage signal;

a subtractor that reduces a level of the corrected voltage signal; and a quantizer that quantizes the reduced voltage signal, in which the photodiode is provided on a light receiving chip stacked on a detection chip, and the quantizer is provided on a detection chip stacked on the light receiving chip.

(7)

The solid-state imaging element according to (6), in which the conversion transistor, the current source transistor, the voltage supply transistor, and the capacitance are provided on the detection chip.

(8)

The solid-state imaging element according to (6), in which the conversion transistor and the voltage supply transistor are N-type transistors, the current source transistor is a P-type transistor, the conversion transistor, the voltage supply transistor, and the capacitance are provided on the light receiving chip, and the current source transistor is provided on the detection chip.

(9)

The solid-state imaging element according to (6), in which the subtractor includes:

a first capacitance having one end connected to an output terminal of the buffer;

an inverter including an input terminal connected to the other end of the first capacitance; and a second capacitance connected to the inverter in parallel, and a capacitance value of each of the capacitance and the second capacitance is smaller than a capacitance value of the first capacitance.

(10)

The solid-state imaging element according to (9), in which the buffer and the first capacitance are provided on the light receiving chip, and the inverter and the second capacitance are provided on the detection chip.

(11)

The solid-state imaging element according to (9), in which the buffer and the subtractor are provided on the detection chip.

(12)

The solid-state imaging element according to (9), in which the buffer is provided on the light receiving chip, and the subtractor is provided on the detection chip.

(13)

The solid-state imaging element according to any of (1) to (12), further including a shield provided between the light receiving chip and the detection chip.

REFERENCE SIGNS LIST

100 Imaging apparatus
110 Imaging lens
120 Record unit
130 Control unit
200 Solid-state imaging element
201 Light receiving chip
202 Detection chip
211, 212, 213, 231, 232, 233 Via arrangement unit
220 Light receiving unit
221 Photodiode
240 Signal processing circuit
251 Row drive circuit
252 Column drive circuit
260 Address event detection unit
300 Address event detection circuit
310 Current-voltage conversion circuit
311 Conversion transistor
312, 331, 333 Capacitor
313 Current source transistor
314 Voltage supply transistor
317 Interwiring capacitance
318 Transistor
320 Buffer
330 Subtractor
332 Inverter
334 Switch
340 Quantizer
341 Comparator
350 Transfer circuit
401 Shield
12031 Imaging unit

The invention claimed is:

1. A solid-state imaging element comprising:

a photodiode that photoelectrically converts incident light and generates photocurrent;

a conversion transistor that converts the photocurrent to a voltage signal and outputs the voltage signal from a gate;
a current source transistor that supplies predetermined constant current to an output signal line connected to the gate;
a voltage supply transistor that supplies a certain voltage corresponding to the predetermined constant current from the output signal line to a source of the conversion transistor; and
a capacitance that is directly connected between the gate and the source of the conversion transistor, wherein a gate of the voltage supply transistor is connected to the source of the conversion transistor via an input signal line, and
the capacitance is an interwiring capacitance between the input signal line and the output signal line.

2. The solid-state imaging element according to claim 1, wherein the input signal line and the output signal line are wired to mutually different wiring layers.

3. The solid-state imaging element according to claim 1, wherein the input signal line and the output signal line are wired to a same wiring layer.

4. The solid-state imaging element according to claim 1, wherein the capacitance has a value in a range of $C_p d/3$ to $C_p d/2$, where $C_p d$ is a capacitance of the conversion transistor on a source side.

5. A solid-state imaging element comprising:
a photodiode that photoelectrically converts incident light and generates photocurrent;
a conversion transistor that converts the photocurrent to a voltage signal and outputs the voltage signal from a gate;
a current source transistor that supplies predetermined constant current to an output signal line connected to the gate;
a voltage supply transistor that supplies a certain voltage corresponding to the predetermined constant current from the output signal line to a source of the conversion transistor; and
a capacitance that is directly connected between the gate and the source of the conversion transistor, wherein the capacitance is a gate capacitance of a transistor.

6. The solid-state imaging element according to claim 5, wherein the capacitance has a value in a range of $C_p d/3$ to $C_p d/2$, where $C_p d$ is a capacitance of the conversion transistor on a source side.

7. A solid-state imaging element comprising:
a photodiode that photoelectrically converts incident light and generates photocurrent, wherein the photodiode is provided on a light receiving chip stacked on a detection chip;
a conversion transistor that converts the photocurrent to a voltage signal and outputs the voltage signal from a gate;
a current source transistor that supplies predetermined constant current to an output signal line connected to the gate;
a voltage supply transistor that supplies a certain voltage corresponding to the predetermined constant current from the output signal line to a source of the conversion transistor;
a capacitance that is connected between the gate and the source of the conversion transistor;
a buffer that corrects the voltage signal;
a subtractor that reduces a level of the corrected voltage signal; and
a quantizer that quantizes the reduced voltage signal, wherein the quantizer is provided on the detection chip stacked on the light receiving chip,
wherein the conversion transistor, the current source transistor, the voltage supply transistor, and the capacitance are provided on the detection chip.

8. A solid-state imaging element comprising:
a photodiode that photoelectrically converts incident light and generates photocurrent, wherein the photodiode is provided on a light receiving chip stacked on a detection chip;
a conversion transistor that converts the photocurrent to a voltage signal and outputs the voltage signal from a gate;
a current source transistor that supplies predetermined constant current to an output signal line connected to the gate;
a voltage supply transistor that supplies a certain voltage corresponding to the predetermined constant current from the output signal line to a source of the conversion transistor;
a capacitance that is connected between the gate and the source of the conversion transistor;
a buffer that corrects the voltage signal;
a subtractor that reduces a level of the corrected voltage signal; and
a quantizer that quantizes the reduced voltage signal, wherein the quantizer is provided on the detection chip, wherein the conversion transistor and the voltage supply transistor are N-type transistors,
the current source transistor is a P-type transistor,
the conversion transistor, the voltage supply transistor, and the capacitance are provided on the light receiving chip, and
the current source transistor is provided on the detection chip.

9. A solid-state imaging element comprising:
a photodiode that photoelectrically converts incident light and generates photocurrent, wherein the photodiode is provided on a light receiving chip stacked on a detection chip;
a conversion transistor that converts the photocurrent to a voltage signal and outputs the voltage signal from a gate;
a current source transistor that supplies predetermined constant current to an output signal line connected to the gate;
a voltage supply transistor that supplies a certain voltage corresponding to the predetermined constant current from the output signal line to a source of the conversion transistor;
a capacitance that is connected between the gate and the source of the conversion transistor;
a buffer that corrects the voltage signal;
a subtractor that reduces a level of the corrected voltage signal; and
a quantizer that quantizes the reduced voltage signal, wherein the quantizer is provided on the detection chip stacked on the light receiving chip, wherein the subtractor includes:
a first capacitance having one end connected to an output terminal of the buffer;
an inverter including an input terminal connected to an other end of the first capacitance; and
a second capacitance connected to the inverter in parallel, and a capacitance value of each of the capacitance and the second capacitance is smaller than a capacitance value of the first capacitance.

10. The solid-state imaging element according to claim 9, wherein the buffer and the first capacitance are provided on the light receiving chip, and the inverter and the second capacitance are provided on the detection chip.

11. The solid-state imaging element according to claim 9, wherein the buffer and the subtractor are provided on the detection chip.

12. The solid-state imaging element according to claim 9, wherein the buffer is provided on the light receiving chip, and the subtractor is provided on the detection chip.

* * * * *